US010620268B2

United States Patent
Hartzsch

(10) Patent No.: US 10,620,268 B2
(45) Date of Patent: Apr. 14, 2020

(54) FAULTY LOAD DETECTION FOR MULTI-PHASE ELECTRIC MOTOR

(71) Applicant: Elmos Semiconductor AG, Dortmund (DE)

(72) Inventor: Jörg Hartzsch, Dortmund (DE)

(73) Assignee: Elmos Semiconductor AG, Dortmund (DE)

( * ) Notice: Subject to any disclaimer, the term of this patent is extended or adjusted under 35 U.S.C. 154(b) by 0 days.

(21) Appl. No.: 16/414,901

(22) Filed: May 17, 2019

(65) Prior Publication Data

US 2019/0324085 A1 Oct. 24, 2019

Related U.S. Application Data

(63) Continuation of application No. 15/321,763, filed as application No. PCT/EP2015/064786 on Jun. 30, 2015, now Pat. No. 10,338,142.

(30) Foreign Application Priority Data

| Jun. 30, 2014 | (DE) | 10 2014 212 572 |
| Jun. 30, 2014 | (DE) | 10 2014 212 586 |
| Jun. 30, 2014 | (DE) | 10 2014 212 626 |

(51) Int. Cl.
*G01R 31/34* (2020.01)
*H02M 1/32* (2007.01)
(Continued)

(52) U.S. Cl.
CPC ............ *G01R 31/343* (2013.01); *H02M 1/32* (2013.01); *H02P 29/0241* (2016.02); *H02P 29/0243* (2016.02); *G01R 19/16547* (2013.01)

(58) Field of Classification Search
None
See application file for complete search history.

(56) References Cited

U.S. PATENT DOCUMENTS

| 5,266,891 A | 11/1993 | Kumar et al. |
| 5,565,753 A * | 10/1996 | Chen ............... H02P 27/02 318/809 |

(Continued)

FOREIGN PATENT DOCUMENTS

| DE | 10216986 A1 | 10/2003 |
| DE | 10236377 A1 | 2/2004 |

(Continued)

OTHER PUBLICATIONS

Johnson, J P et al; "Review of Sensorless Methods for Brushless DC", Conference record of the 1999 IEEE Industry Applications Conference; Thirty-fourth IAS annual meeting (CAT. No. 99CH36370), IEEE, IEEE Piscataway, NJ, USA, vol. 1, Oct. 3, 1999 (Oct. 3, 1999), pp. 143-150, XP010355155, DOI: 10.1109/IAS.1999.799944; ISBN: 978-0-7803-5589-7.

(Continued)

*Primary Examiner* — Bickey Dhakal
(74) *Attorney, Agent, or Firm* — Bejin Bieneman PLC

(57) ABSTRACT

An electric motor is electrically commutated with the aid of circuitry, in which the phase current experiences a zero crossing at certain time points per motor phase. Owing to the inductive load portion, the time of said zero crossing of a phase current occurs at different times to the time of the zero crossing that would arise with purely ohmic loads. Without a faulty load condition, the time of said zero crossing is within an expected value range (e.g., expected time window) which can be determined by the circuitry, the ambient conditions and by diverse motor parameters. During occurrence of the a high-side and/or low-side phase connection, it is determined whether and when the current through the switched-on high-side of low-side switch becomes greater or smaller than a predeterminable threshold wherein said time measurement can extend over one or more PWM cycles.

11 Claims, 11 Drawing Sheets

(51) Int. Cl.
*H02P 29/024* (2016.01)
*G01R 19/165* (2006.01)

(56) References Cited

U.S. PATENT DOCUMENTS

| | | | | |
|---|---|---|---|---|
| 7,288,911 B2 * | 10/2007 | MacKay | ................. | H02P 6/182 318/400.21 |
| 7,554,280 B2 * | 6/2009 | Viti | ........................ | H02P 6/182 318/400.11 |
| 8,054,026 B2 | 11/2011 | Shimana et al. | | |

FOREIGN PATENT DOCUMENTS

| | | |
|---|---|---|
| DE | 69721455 T2 | 4/2004 |
| DE | 10 2004 009 046 B3 | 5/2005 |
| DE | 10 2008 052933 A1 | 4/2010 |
| DE | 10 2011 003897 A1 | 8/2012 |
| DE | 10 2011 004911 A1 | 9/2012 |
| DE | 10 2014 212 626 B3 | 10/2015 |
| DE | 10 2014 212 572 A1 | 12/2015 |
| DE | 10 2014 212 586 B3 | 12/2015 |
| EP | 1136828 A2 | 9/2001 |
| EP | 2116857 A1 | 11/2009 |
| EP | 2164169 A1 | 3/2010 |

OTHER PUBLICATIONS

International Search Report and Written Opinion for PCT/EP2015/064786 dated Sep. 14, 2015 (with English translation; 13 pages).

* cited by examiner

FAULTY LOAD DETECTION FOR MULTI-PHASE ELECTRIC MOTOR

CROSS-REFERENCE TO RELATED APPLICATIONS

This application claims priority to U.S. patent application Ser. No. 15/321,763, filed Dec. 23, 2016, which application is a national stage of, and claims priority to, Patent Cooperation Treaty Application No. PCT/EP2015/064786, filed on Jun. 30, 2015, which application claims priority to German Patent Application No. 10 2014 212 586.3, filed on Jun. 30, 2014, German Patent Application No. 10 2014 212 572.3, filed on Jun. 30, 2014, and German Patent Application No. 10 2014 212 626.6, filed on Jun. 30, 2014, wherein the contents of said applications are herewith included in their entireties, by reference, into the subject matter of the present patent application.

BACKGROUND

The disclosure relates to a method for obtaining an indication, in particular an initial indication, of a possible faulty load condition of a multi-phase electric motor.

Faulty load conditions in electric motors are critical particularly when short circuits occur. Such short circuits are normally detected on the basis of voltage drops along the drain-source paths of the internal or external driver transistors of the drive unit that are used to drive the electric motors or other loads. Normally, these voltage drops are evaluated individually, i.e. per phase of the motor. In case that a metrologically detected current is higher than the maximum current allowable in operation, this is an indicator of an external short circuit in at least one of the motor connection lines. A disadvantage in the detection of short circuits resides in that particularly "soft" short circuits toward ground cannot be detected in all cases. A further problem consists in that, in case of relatively high-ohmic short circuits or short circuits with added inductive factor of the short circuit current, the overcurrent will partly not lie outside the maximum current allowable in operation of the motor. Further, in added inductive factors and in PWM controlling of loads such as e.g. electric motors, it may happen that the increase of the current in case of a short circuit is so slow ("soft" short circuit) that a PWM cycle will have ended before the overcurrent switch-off threshold value has been reached. Nonetheless, in such cases, the power transistors may heat up so massively that damage will be caused that can occur so fast that also a detection of excess temperature, due to its temporal delay, will not offer sufficient protection.

From DE-A-10 2011 004 911, DE-B-10 2004 009 046, DE-A-102 36 377 and U.S. Pat. No. 5,266,891, methods for detection of faulty load conditions in multi-phase electric motors are known, wherein, according to each of said documents, the temporal development of the phase currents is evaluated.

SUMMARY

Therefore, it is an object of the disclosure to provide a short circuit detection which is capable of discovering a short circuit in a reliable manner and thus to protect the transistors from damage, to the effect that a burning of the electronic system can be prevented.

To achieve the above object, there is proposed, according to the disclosure, a method as defined below. Individual examples are additionally disclosed.

The method according to the disclosure serves for obtaining an indication, in particular an initial indication, of a possible faulty load condition of a multi-phase inductive load with electronic commutation, particularly a three-phase electric motor with electronic commutation (e.g. BLDC, EC, SR and stepper motors) having a drive unit which, per motor phase, comprises a high-side switch and a low-side switch, wherein the high-side and low-side switches of the motor phases are cyclically switched according to a switching scheme which generates time points at which the current experiences, in a motor phase, a zero crossing that, owing to the inductive load portion, is temporally shifted relative to that time point of the zero crossing which would occur with purely ohmic loads, wherein, without a faulty load condition, the time point of this zero crossing is within an expected value range (e.g. expectation time window) which can be determined by the switching scheme, the ambient conditions (e.g. supply voltage and temperature) and by diverse motor parameters (which may also include motor asymmetries), wherein, in case of an existing faulty load condition, the time point of this zero crossing is outside the expected value range, wherein, on the basis of the deviation from the expected value range, a conclusion can be made on the type of the faulty load condition, wherein, in said method, during predetermined high-side and/or low-side phase connection occurring in the switching scheme, it is detected whether and when the current through the switched-on high-side or low-side switch becomes greater or smaller than a presettable threshold value which particularly is in the vicinity of the zero crossing, wherein, from a presettable time point of the switching scheme, the time interval is measured within which the current flowing through the switched-on high-side or low-side switch of one of the two motor phases rises above or falls below the presettable threshold value, wherein, in case of a PWM control, this time measurement can optionally extend over one or a plurality of PWM cycles (cycles of alternating driving of the high-side switch and the low-side switch), wherein the measured time intervals of the individual motor phases are compared among each other, and/or the measured time intervals of each individual motor phase in itself are compared, temporally successively, to each other and/or with the expected value ranges, and wherein a deviation, from presettable expected value ranges, of the amount of the measured time intervals in the individual motor phases among each other and/or in one motor phase in sequential order, is evaluated as being an indication of a faulty load condition.

According to the disclosure, the electric commutation of the electric motor is performed with the aid of a switching scheme in which, at certain time points per motor phase, the phase current experiences a zero crossing. The time point of this zero crossing of a phase current is temporally offset relative to that time point where purely ohmic loads would occur. Without a faulty load condition, the time point of this zero crossing is situated within an expected value range (e.g. expected time window) which can be determined by the switching scheme, the ambient conditions and by diverse motor parameters. If the zero crossing is situated outside the expected value range, this can be interpreted as an indicator of a faulty load condition. faulty load condition. By observing whether—and, if so, how far—the expected time points of zero crossings deviate from the expected value ranges or are situated within these, it is possible to conclude on possible malfunction sources of the motor. In any case, deviations, from presettable expected value ranges, of the amounts of the measured time intervals in the individual motor phases among each other and/or in each individual motor phase in sequential order, are an indication—in particular an initial indication—of a faulty load condition. The manner in which such an initial indication will be handled after it has been received, is not part of the subject matter of the disclosure anymore. Depending on the respective application, the processing of such initial indications can be performed in different manners. For instance, it is possible to first observe initial indications and then to react only with a certain temporal delay. Also the possible reactions can be quite different in dependence on the respective application. Thus, for instance, the motor can be switched off or be set into a different operational mode for protection against damage.

For classification of the deviation of the respective parameter from the corresponding expectation value or range, use can be made of methods for statistical pattern recognition by which operational states of the electric (stepper) motor can be classified so that defined measures can be taken for minimizing the effects of a fault and for prognosticating the future effects of a fault on the motor. In doing so, the prognosis can be given in the form of possible future operational states to which there are assigned likelihoods and/or valuation numbers (e.g. effect evaluations).

Herein, there can be performed one or a plurality of the processing steps listed hereunder:

a) Formation of a feature vector from a plurality of values of the deviations that are detected simultaneously and/or sequentially, wherein the feature vector can comprise simple and higher derivatives and/or simple and higher integrals of these values and/or other magnitudes derived from these values as well as other magnitudes from other sensor systems.

b) Multiplication of a feature vector by a linear discriminant analysis (LDA) matrix into a modified feature vector for increasing the selectivity.

c) Comparison of the modified feature vector with prototypical vectors, i.e. the operating state prototypes which have been stored particularly in a prototype database, wherein the result of the comparison is a binary and/or digital and/or analog distance value between the modified feature vector and the respective prototypical vector per evaluated prototypical vector.

d) Selection of at least one operating state prototype of said database on the basis of a distance value, there being selected particularly the operating state prototype with the smallest distance value and/or the operating state with the most massive effect and/or with the most massive effect evaluation.

e) Output at least one of the selected operating state prototypes.

f) Optionally, output at least one of the distance value which is assigned to the feature vector relative to the selected operating state prototype, and/or a value derived therefrom.

g) Optionally, output of further selected operating state prototypes and associated distance values and/or values derived therefrom, for output of a hypothesis list which typically also comprises the selected operating state prototype and its distance value.

h) Optionally, detection of the most likely chain of operating state prototypes and prognosis of at least one following prognosticated operating state or of a prognosticated operating state sequence.

i) Optionally, initiation of measures on the basis of the selected operating state and/or the detected hypothesis list and/or the prognosticated operating state or the prognosticated operating state sequence.

Alternatively to the per se known basic methods of statistic pattern recognition, the processing of the deviations of the respective parameter from the expectation value or range associated thereto can be performed by use of neuronal networks and/or Petri nets and/or fuzzy logic and/or a Viterbi algorithm.

The expectation values and respectively expectation value ranges are suitably determined empirically. In this respect, it can be provided that the expectation values for maximally allowable deviations where it is not yet desired that a faulty load condition is detected, are obtained, by training, on one or a plurality of pre-aged reference systems with fault-free load condition, i.e. the typical values are detected and, provided with selectable additional allowable tolerances, are deposited in the drive unit as a maximum allowable expectation value range, and/or that the expectation values for maximally allowable deviations where it is not yet desired that a faulty load condition is detected, are—after production—obtained, by training, on each motor system for itself with fault-free load condition, i.e. the typical values are detected and, provided with selectable additional allowable tolerances, are deposited in the drive unit as a maximum allowable expectation value range, and/or that the expectation values for maximally allowable deviations where it is not yet desired that a faulty load condition is detected, are, in the course of the lifespan of the motor, provided with higher tolerances, and/or that the detected faulty load condition will be generated by deviation of the commutation angle from the target range and that the drive unit will compensate for the error by adaptation of at least one of the two drive parameters "amplitude" and "phase".

According to an advantageous example, it can be provided that, from the type of the deviations from the expected value ranges for the individual motor phases among each other, conclusions are drawn on the type of the faulty load condition such as e.g. shunt of motor phase toward motor phase, shunt of motor phase toward ground, shunt of motor phase toward supply voltage, too high-ohmic motor phase connection (possibly caused by contacting problems in plugs), loose contact of a motor phase, faulty driver resistances of individual high-side or low-side drivers (optionally only in case of certain load conditions), and/or conclusions are drawn, for each individual motor phase in sequential order, on faulty load conditions such as e.g. a loose contact, a mechanical defect, play of a bearing, malfunction in the transmission, or a mechanical error in the application, wherein the frequency of the sequentially occurring deviations can provide a conclusion on the exact site of the fault.

According to an advantageous example, it can further be provided that, instead of the amount of a current, there is measured an electrical parameter representing the amount of the current, e.g. a voltage drop across an electric/electronic component, particularly across a shunt resistor or a transistor which particularly is a high-side and/or a low-side switch.

Further, it can be advantageous to select, as a current threshold value, a value of the current that is not equal to zero.

Further, it can be of advantage to select, as a current threshold value, a value near the zero crossing.

It can be of advantage to measure said time interval by means of a linear time measurement element with constant counting speed.

Further, it can be of advantage to measure said time interval by means of a logarithmic time measurement element having a counting speed increasing with increasing measuring time.

According to an advantageous example, it can further be provided that, instead of the described exact time measurement, there is performed, merely at a fixed time point after connection of the high-side and/or low-side driver, an examination for an exceeding or falling-short of the presettable current threshold value and, in accordance therewith, the time measurement is performed in the thus generated resolution (number of PWM cycles).

It can be of advantage if, instead of the time interval between said time point of the switching scheme and the reaching of the current threshold value, there is measured the time interval until the current, upon the next motor phase connection, reaches the current threshold value again, and that these time intervals of the individual motor phases are compared among each other and/or the time intervals of each motor phase for itself are compared in temporal succession or are compared to an expectation value which is valid for fault-free operation of the motor, wherein a deviation of the amount of the present time intervals among each other and/or from the expectation value is evaluated as an indication, in particular an initial indication, of a faulty current.

The disclosure has to be seen particularly in view of the trend that, for the driving of multi-phase electric motors or other inductive loads, increased use is made of low-ohmic power transistors. These power transistors can be produced at such low expense that their total costs for the overall system are lower than in a case where e.g. a cooling body would be used for cooling conventional power drivers which have a higher $R_{SDON}$. A further advantage of the use of modern low-ohmic power transistors is to be seen in the simplified installation of the electronics due to the lower power loss of these power transistors. Further, viewed in the total energy balance, the $CO_2$ exhaust is reduced. However, because of the low-ohmic power transistors, the voltage drops in case of a short circuit are, due to the low $R_{SDON}$, so small that the occurrence of a short circuit cannot be reliably detected anymore with the aid of the currently available means. Therefore, one uses distinctly more-sensitive short-circuit threshold values in order to meet the changed demands caused by low-ohmic power transistors. On the other hand, these solutions to the problem are not suited to detect all cases of short circuits. Particularly in view of BLDC and DC bridge driver ICs and stepper motor driver ICs, the disclosed solution has clear advantages because, as a result of the high demand for such driver ICs, it would quickly become established on the market.

A first variant of the disclosure relates to a method for obtaining an indication, in particular an initial indication, of a possible faulty load condition of a multi-phase electric motor.

Faulty load conditions in electric motors are critical particularly when short circuits occur. Such short circuits are normally detected on the basis of voltage drops along the drain-source paths of the internal or external driver transistors of the drive unit that are used to drive the electric motors or other loads. Normally, these voltage drops are evaluated individually, i.e. per phase of the motor. In case that a metrologically detected current is higher than the maximum current allowable in operation, this is an indicator of an external short circuit in at least one of the motor connection lines. A disadvantage in the detection of short circuits resides in that particularly "soft" short circuits toward ground cannot be detected in all cases. A further problem consists in that, in case of relatively high-ohmic short circuits or short circuits with added inductive factor of the short circuit current, the overcurrent will partially not lie outside the maximum current allowable in operation of the motor. Further, in added inductive factors and in PWM controlling of loads such as e.g. electric motors, it may happen that the increase of the current in case of a short circuit is so slow ("soft" short circuit) that a PWM cycle will have ended before the overcurrent switch-off threshold value has been reached. Nonetheless, in such cases, the power transistors may heat up so massively that damage will be caused that can occur so fast that also an excess temperature detection, due to its temporal delay, will not offer sufficient protection.

The monitoring of an electric motor with the objective of detecting a malfunction is known e.g. from DE-A-10 2011 003 897 and DE-T-697 21 455.

Therefore, it is an object of the disclosure to provide a detection of faulty load conditions such as e.g. of short circuits which is capable of discovering such conditions in a reliable manner and thus to protect the application, i.e. the hardware driven by the driver transistors, from damage, to the effect that e.g. a burning of the electronic system, which up to now could not be avoided in all cases, can be reliably prevented.

To achieve the above object, there is proposed, according to the disclosure, a method as defined below. Individual examples are additionally disclosed.

Thus, according to the disclosure, there is proposed a method for obtaining an indication, in particular an initial indication, of a possible faulty load condition of a multi-phase electric motor with electronic commutation (e.g. BLDC, EC, PMSM, SR and stepper motors) having a drive unit which, per motor phase, comprises a high-side switch and a low-side switch, wherein the high-side and low-side switches of the motor phases are cyclically switched according to a switching scheme which, per motor phase, comprises at least one cyclically recurrent equivalent time point, wherein these equivalent time points have, between the individual motor phases, an identical temporal phase shift (for instance, in 3-phase motors, the phase shift is 120° and in 4-phase motors is 90° for technical reasons), wherein, at these time points, the respective amount of the current in the respective motor phase is each time in a substantially identical relation to the amounts of the currents in the other motor phases at their appertaining equivalent time points, wherein, in said method, для at least two motor phases, at the cyclically recurrent equivalent time points of the switching scheme, a measurement value is detected which represents the amount of the current in the respective motor phase and this process is performed in a cyclically repetitive manner, the detected measurement values of the motor phases are compared to each other at least in pairs, wherein each comparison of the measurement values is examined as to whether the result of the comparison is within an expectation range which is valid with respect to the to-be-compared motor phases for fault-free load conditions, and wherein a deviation of the result from the appertaining expectation range, particularly under consideration of a presettable allowable tolerance, is evaluated as being an indication, in particular an initial indication, of a faulty load condition such as e.g. a loose contact, a mechanical defect, play of a bearing, malfunction in the transmission, or mechanical errors in the application, wherein the repetition rate of similar, sequentially occurring deviations can allow for a conclusion on the site of the malfunction, and/or optionally, also the analysis of the current values of at least one motor phase is performed, at the equivalent time points, for itself in sequential succession and a deviation of the results from the expectation range, particularly under consideration of a presettable allowable tolerance, is evaluated as being an indication, in particular an initial indication, of a faulty load condition such as e.g. a loose contact, a mechanical defect, play of a bearing, malfunction in the transmission, or mechanical errors in the application, wherein the repetition rate of similar, sequentially occurring deviations can allow for a conclusion on the site of the malfunction.

Further, it is provided according to the disclosure that the high-side switches of at least two motor phases have assigned to them a high-side monitoring unit for monitoring the drain-source voltage drops of the high-side switches and/or that the low-side switches of at least two motor phases have assigned to them a low-side monitoring unit for monitoring the drain-source voltage drops of the low-side switches, and that each monitoring unit is used for detection of a measurement value which represents the magnitude of a current in a motor phase.

Still further, it is provided according to the disclosure that each of the monitoring units comprises a comparator and a digital/analog converter for presetting a reference value as a voltage-drop threshold value for detecting an overcurrent in a high-side and/or low-side switch for the comparator, and that this reference value is modulated for detecting, by evaluation of the comparator, a measurement value representing the amount of the present current, wherein a response of the comparator occurring during the detecting of the measurement value is not directly evaluated as indicating an overcurrent but, in this case, the detection of the measurement value is concluded and, subsequently, the reference of the digital/analog converter is switched to the actual overcurrent value and, then, there is performed a real evaluation as to whether an overcurrent situation has occurred.

According to the disclosed method, it is provided that, at specific cyclically recurring, i.e. equivalent time points of a motor current feed scheme, the respectively flowing currents are detected within a motor phase or generally across the motor phases. The thus detected current values are then compared to each other and respectively set in relation to each other wherein, also here, the current values are observed only per phase or, however, generally across the motor phases. The comparison of the current values and respectively the calculation of the ratio between the current values will lead to a result which is within an optionally predetermined expectation value range or within an expectation value range which has been detected previously in an empirical manner or by measurement on an electric motor. If the result of the comparison and respectively of the calculation of the ratio between the current values deviates from this expectation value range, this is to be considered as an indicator or initial indicator of a possible faulty load condition of the electric motor. Starting therefrom, steps can now be taken in dependence on the given application, e.g. by issuing a warning or effecting a forced switch-off of the electric motor. The procedure following the detection of an indicator of a faulty load condition of the electric motor does not necessarily belong to the disclosure.

As compared to the state of the art, the use of the disclosed method results in an increased reliability of the detection of faulty load conditions, which is achieved by improved useful signals and an improved performance of the detection method. The detection threshold value for the existence of a faulty load condition (e.g. short circuit) is not dependent anymore on the amount of the maximum current allowable in operation. Further, the method can be implemented in an inexpensive manner.

The disclosure has to be seen particularly in view of the trend that, for the driving of multi-phase electric motors or other inductive loads, increased use is made of low-ohmic power transistors. These power transistors can be produced at such low expense that their total costs for the overall system are lower than in a case where e.g. a cooling body would be used for cooling conventional power drivers which have a higher $R_{SDON}$. A further advantage of the use of modern low-ohmic power transistors is to be seen in the simplified installation of the electronics due to the lower power loss of these power transistors. Further, viewed in the total energy balance, the $CO_2$ exhaust is reduced. However, because of the low-ohmic power transistors, the voltage drops in case of a short circuit are, due to the low $R_{SDON}$, so small that the occurrence of a short circuit cannot be reliably detected anymore with the aid of the currently available means. Therefore, one uses distinctly more-sensitive short-circuit threshold values in order to meet the changed demands caused by low-ohmic power transistors. On the other hand, these solutions to the problem are not suited to detect all cases of short circuits. Particularly in view of BLDC and DC bridge driver ICs and stepper motor driver ICs, the disclosed solution has clear advantages because, as a result of the high demand for such driver ICs, it would quickly become established on the market.

As evident from the above, it is not sufficient if the currents and respectively the voltage drops across the switching driver transistors are monitored individually. Instead, it is provided according to the disclosure that the currents of a plurality—and, in the ideal case, all—of the driver transistors are compared to each other nearly simultaneously. For this purpose, a plurality of measurement devices can be provided, while, on the other hand, for reasons of effectiveness, it is also possible to use a (e.g. a sole) measurement device sequentially. In doing so, one can make use of the recognition that both the single current and (in case of a plurality of windings) the current of all motor windings cannot experience all too fast changes by the inductivity of the winding. Within certain limits, it is also possible to measure, with temporal offset, the currents of all participating power transistors (in a specific application, e.g. as voltage drop across the respective power transistors) and still to obtain, with merely slight restriction, an up-to-date picture. As far as possible, during the PWM control of the driver transistors, there can also be performed a simultaneous or nearly simultaneous measurement of the different motor and respectively load phases.

Further, the disclosed method makes use of the circumstance that, in a system comprising a multi-phase electric motor and a drive unit, it will be the case that, without an additional short circuit of one or a plurality of motor phases toward the positive supply potential, the sum of the currents of all high-side drivers will be equal to the sum of the currents of all low-side drivers. If a disparity occurs in this respect, it can be assumed that a short circuit exists toward a potential outside the motor. The method of the disclosure is applicable to nearly all motor types (types of electric motors) that are driven by high-side or low-side drivers; a corresponding possibility exists for the driving of inductive loads other than electric motors.

Concerning the current measuring methods, the disclosed method can be designed in different ways, corresponding to the usual current measuring methods. Thus, for instance, the disclosed method can be realized with analog voltage measurements and, further, with analog or also digital computation of the difference and respectively the comparison and/or the ratio of the individual current values. Of a more compact nature, however, will be a realization in SC (switched-capacitor) technology wherein the individual voltages, while provided with a sign, will be "stacked" and the remaining difference (comparison) will then be compared to a threshold value. Also here, from a certain point onward, digital processing may be more favorable. It is also possible to discharge the voltage drops of capacitances, to digitally measure the discharge times and to perform a digital evaluation based on the measurements. In this case, the special version appears to be of interest wherein the discharge is performed via switched capacitors and the number of required discharge cycles is counted and further processed. Because of the possible low signal level, there may be of interest the version wherein, before or after "stacking", the signal will still be amplified wherein, in the special case, such an amplification can be performed sufficiently often (voltage multiplication) until a certain reference voltage has been reached. The number of amplification cycles required for this purpose can then be further processed as a measure for the resultant value. In case of a high-side driver, this further processing can be performed directly "up" in the high voltage range or, however, the signal can first be transferred into the low voltage range by way of "voltage mirroring" and there, if required, be placed on capacitances. In the latter case, it is then preferred to use the same structures in all measurements, whereby possible offset errors will be compensated to the largest part. The remaining offset errors can be compensated by means of a reference offset measurement in the non-energized case.

The expectation values and respectively expectation value ranges are suitably determined empirically. In this respect, it can be provided that the expectation values for maximally allowable deviations where it is not yet desired that a faulty load condition is detected, are obtained, by training, on one or a plurality of pre-aged reference systems with fault-free load condition, i.e. the typical values are detected and, provided with selectable additional allowable tolerances, are deposited in the drive unit as a maximum allowable expectation value range, and/or that the expectation values for maximally allowable deviations where it is not yet desired that a faulty load condition is detected, are—after production—obtained, by training, on each motor system for itself with fault-free load condition, i.e. the typical values are detected and, provided with selectable additional allowable tolerances, are deposited in the drive unit as a maximum allowable expectation value range, and/or that the expectation values for maximally allowable deviations where it is not yet desired that a faulty load condition is detected, are, in the course of the lifespan of the motor, provided with higher tolerances, and/or that the detected faulty load condition will be generated by deviation of the commutation angle from the target range and that the drive unit will compensate for the error by adaptation of at least one of the two drive parameters "amplitude" and "phase".

According to a simplified variant of the disclosed method, a short circuit can be detected by exclusive observation of the low-side voltage drops across a complete driving period. When the motor current is, in principle, unchanged, the sum of all voltage drops of all active low-side drivers should be identical over time, irrespective of which low-side driver is presently active. A short circuit in one of the motor paths should result in differences of the low-side sum currents in dependence on the combination of the presently active low-side drivers. By comparison of the drops of the single voltages among each other, it is additionally possible to detect short circuits in windings, or non-contacted windings. In case of a suitable sensitivity of the measurement device, the above described signals can also be used for commutating the motor. According to an alternative method, it is possible to examine low-pass-filtered single voltages or also the low-pass-filtered middle voltages (e.g. virtual star point) for their concrete expectation value range. If the voltage significantly deviates from the expectation value range, the system has been brought out of its "equilibrium" by a shunt.

According to a preferred example of the disclosure, it can be provided that, from the motor phase pairing or motor phase combination for which a deviation outside the expectation range is detected, and from the position of the appertaining equivalent time points within the switching scheme, a conclusion is drawn on the type of the faulty load condition for which the deviation is evaluated as an indicator, particularly an initial indicator.

Further, it can be suitable if the measurement value corresponding to the amount of the current is an electrical parameter, e.g. a voltage drop across an electric/electronic component, particularly across a shunt resistor or a transistor which particularly is a high-side and/or a low-side switch.

It can be advantageous if the modifying of the reference value starts at the reference value for detection of an overcurrent and is continued toward lower amounts, wherein, for determining the measurement value which is to be detected, the comparator is operative to respond only once at the end of the reduction.

In this connection, it can further be advantageous if the reduction of the amount of the reference value is performed not linearly but in logarithmically approximated steps in such a manner that the percentage reduction is approximately equal from one amount to the next.

The modulation of the reference value can also be performed according to a successive approximation, wherein, upon each response of the comparator, the detection of the measurement value is interrupted so as to insert an examination for a possible overcurrent situation.

An advantageous variant of the disclosure can be seen in that a detected initial indicator of a possible faulty load condition is examined for temporal repetition and, in case of at least cyclically continuous repetition, a faulty load condition is concluded to exist when a presettable frequency is exceeded.

According to a preferred example of the disclosure, it can further be provided that, when, in a fault-free system comprising at least an electric motor and a drive unit, a cyclically reproducible indication of a faulty load condition is detected, this indication is not attributable to a real faulty load condition but to an electrical and/or mechanical asymmetry between the motor phases of at least one of the system components such as e.g. the drive unit and/or the motor mechanics and/or the transmission and/or another component part driven by the electric motor, and this asymmetry is considered in future presettable expectation value ranges for a fault-free system.

Finally, if required, it can further be provided that, when, in a fault-free system comprising at least an electric motor and a drive unit, a cyclically reproducible indication of a faulty load condition is detected, this indication is not attributable to a real faulty load condition but to an electrical and/or mechanical asymmetry between the motor phases of at least one of the system components such as e.g. the drive unit and/or the motor mechanics and/or the transmission and/or another component part driven by the electric motor, and this asymmetry is compensated, via modulation of the switching scheme, for obtaining improved system properties.

In special cases, the initial indication of a faulty load condition can be a result of the deviation of the commutation angle from its desired value and, in this case, it can be helpful that the drive unit is operative to compensate for the error by adapting at least one of the drive parameters "amplitude" and "phase" and "rotational frequency".

In case of a three-phase electric motor, that time point where the measurement value is detected at least at one motor phase can be identical with the time point where, at another motor phase, a zero current is detected (e.g. using any desired method such as e.g. by means of a BEMF comparator).

According to a preferred example, it can be provided that the measurement value representing the current is a voltage drop (e.g. via the driver or the shunt element) and that, for detection of the result of the comparison of two measurement values, differences and/or absolute values of individual voltage drops are applied to switched capacitances and are treated and/or evaluated by means of at least one method from the group of the methods mentioned hereunder: amplification, stacking of temporally sequential measurement values, comparison, difference formation, filtration, A/D conversion.

According to a particularly preferred example of the disclosure, the current values of the individual motor connections can be sequentially detected by detecting them under identical current feed conditions, i.e. with specific identical phase ratios in the switching scheme. Then, it will be evaluated whether the ratio of the currents in the individual motor connections deviates from a previously detected expectation value range (relative to the ratios).

On the basis of the duration of such potentially occurring deviations, it can be detected whether these are short disturbances (loose contact or disturbances on the supply level or disturbances of the load ratios) or permanent or continuously recurrent faulty load conditions. Such faulty load conditions can, in the course of time, cause heat-up of component parts and lead to damage. Depending on the gravity of the consequences of a detected fault, a motor will be switched off, throttled or be operated in an evade mode which will reduce or prevent a heat-up caused by the influence of faults. For instance, electrically commutated motors can be operated also with omission of the driving of individual switching components.

For classification of the deviation of the respective parameter from the corresponding expectation value or range, use can be made of methods for statistical pattern recognition by which operational states of the electric (stepper) motor can be classified so that defined measures can be taken for minimizing the effects of a faults and for prognosticating the future effects of a fault on the motor. In doing so, the prognosis can be given in the form of possible future operational states to which there are assigned likelihoods and/or valuation numbers (e.g. effect evaluations).

Herein, there can be performed one or a plurality of the processing steps listed hereunder:

a) Formation of a feature vector from a plurality of values of the deviations that are detected simultaneously and/or sequentially, wherein the feature vector can comprise simple and higher derivatives and/or simple and higher integrals of these values and/or other magnitudes derived from these values as well as other magnitudes from other sensor systems.

b) Multiplication of a feature vector by a linear discriminant analysis (LDA) matrix into a modified feature vector for increasing the selectivity.

c) Comparison of the modified feature vector with prototypical vectors, i.e. the operating state prototypes which have been stored particularly in a prototype database, wherein the result of the comparison is a binary and/or digital and/or analog distance value between the modified feature vector and the respective prototypical vector per evaluated prototypical vector.

d) Selection of at least one operating state prototype of said database on the basis of a distance value, there being selected particularly the operating state prototype with the smallest distance value and/or the operating state with the most massive effect and/or with the most massive effect evaluation.

e) Output at least one of the selected operating state prototypes.

f) Optionally, output at least one of the distance value which is assigned to the feature vector relative to the selected operating state prototype, and/or a value derived therefrom.

g) Optionally, output of further selected operating state prototypes and associated distance values and/or value derived therefrom, for output of a hypothesis list which typically also comprises the selected operating state prototype and its distance value.

h) Optionally, detection of the most likely chain of operating state prototypes and prognosis of at least one following prognosticated operating state or of a prognosticated operating state sequence.

i) Optionally, initiation of measures on the basis of the selected operating state and/or the detected hypothesis list and/or the prognosticated operating state or the prognosticated operating state sequence.

Alternatively to the per se known basic methods of statistic pattern recognition, the processing of the deviations of the respective parameter from the expectation value or range associated thereto can be performed by use of neuronal networks and/or Petri nets and/or fuzzy logic and/or a Viterbi algorithm.

A particularly preferred variant of the disclosure which is applicable for any desired multi-phase motors, is to be seen in the modification of the method for the case that individual current measurement devices are not available for all motor connections. Here, use is made of existing current measurement devices for detection of the overall motor current. To allow for an evaluation in spite of these restrictions, there is required a special timing which is still to be described. According to a further specific modification of the disclosure, use is made of possibly existing measurement devices of a parameterizable overcurrent switch-off device so as to perform, in a special configuration, the described current measurement. In the process, a digital reference value for measuring the present current that is required for overcurrent switch-off, will be modulated until a comparator of the overcurrent switch-off device will trigger the switch-off. In this case, however, there does not occur a forced switch-off of the switching components but only a storing of the detected digital reference value, at the time of comparator reaction, as a present current value. To make it possible, during this measurement, to continue to guarantee the function of overcurrent switch-off in case of a low-ohmic short circuit, it is required that, very briefly after reaching the comparator threshold value, the reference value is switched back to the "normal" reference value for overcurrent detection and that the switch-off reaction to a response of the comparator is reactivated. If the driving is to be performed by a microprocessor, a sufficiently fast reaction is not reliably guaranteed. In this case, the digital reference value of the overcurrent switch-off should be statically available, and a logic circuit should be a able, via hardware, to switch to this reference value at a sufficient speed.

A further variant of the disclosure relates to a method for obtaining an indication, in particular an initial indication, of a possible faulty load condition of a multi-phase electric motor.

Faulty load conditions in electric motors are critical particularly when short circuits occur. Such short circuits are normally detected on the basis of voltage drops along the drain-source paths of the internal or external driver transistors of the drive unit that are used to drive the electric motors or other loads. Normally, these voltage drops are evaluated individually, i.e. per phase of the motor. In case that a metrologically detected current is higher than the maximum current allowable in operation, this is an indicator of an external short circuit in at least one of the motor connection lines. A disadvantage in the detection of short circuits resides in that particularly "soft" short circuits toward ground cannot be detected in all cases. A further problem consists in that, in case of relatively high-ohmic short circuits or short circuits with added inductive factor of the short circuit current, the overcurrent will partially not lie outside the maximum current allowable in operation of the motor. Further, in added inductive factors and in PWM controlling of loads such as e.g. electric motors, it may happen that the increase of the current in case of a short circuit is so slow ("soft" short circuit) that a PWM cycle will have ended before the overcurrent switch-off threshold value has been reached. Nonetheless, in such cases, the power transistors may heat up so massively that damage will be caused that can occur so fast that also an excess temperature detection, due to its temporal delay, will not offer sufficient protection.

Methods for faulty current detection in electric motors with electric commutation are known e.g. from DE-A-102 16 986, U.S. Pat. No. 8,054,026, EPA-2 164 169 and EP-A-2 116 857 and are based on a comparison of patterns of repetitively occurring electric parameters of the electric motor against expectation values that are valid for fault-free operation of the motor.

Therefore, it is an object of the disclosure to provide a short circuit detection which is capable of discovering a short circuit in a reliable manner and thus to protect the transistors from damage, to the effect that a burning of the electronic system can be prevented.

To achieve the above object, there is proposed, according to the disclosure, a method as defined below. Individual examples are additionally disclosed.

The method according to the disclosure serves for obtaining an indication, particularly an initial indication, of a possible faulty load condition of a multi-phase electric motor with electric commutation (e.g. BLDC, EC, SR or stepper motors) having an electric drive unit which, per motor phase, comprises a high-side switch and a low-side switch, wherein the high-side and low-side switches of the motor phases are cyclically switched on and off according to a switching scheme which comprises cyclically recurrent time points at which, for at least one motor phase, both the high-side switch and the low-side switch are switched to high-ohmic state, i.e. are switched off, for a switch-off interval, wherein, in case of a faulty load condition, at least at the start of individual switch-off intervals or also over a plurality of switch-off intervals, a current is still flowing for a certain recirculation time interval which is equal to an expectation value valid for a fault-free operation of the electric motor, wherein, in said method, at the start of a switch-off interval preset in the switching scheme, a time measurement unit is started and the recirculation time interval is measured until which a current is still flowing in the switched-off motor phase that has a magnitude whose sign-independent amount is larger than a predetermined threshold value, wherein, if the recirculation time interval is not terminated during said switch-off interval, this time measurement is continued at least in the next switch-off interval until the recirculation time interval is terminated, wherein this process is repeated for switch-off intervals after preceding high-side switch activation and/or after preceding low-side switch activation of each motor phase, wherein the measured recirculation time intervals are compared for the different motor phases among each other and/or for respectively one motor phase in sequential succession and/or with the expectation value or the expectation value range, and wherein a deviation from the respective expectation value is evaluated as being an indicator, particularly an initial indicator, of the existence of a faulty current.

According to the disclosure, there is thus provided a current feed scheme for powering a multi-phase electric motor, which, per motor phase, provides high-side and low-sides switches that are operable in a high-ohmic state. Thus, both of these switches of a motor phase are briefly switched off. Thereby, owing to the inductive load that the electric motor represents, a current will flow whose decaying—and particularly whose decaying time—will allow for conclusions as to whether the electric motor is presently running under faulty load conditions. For this purpose, according to the disclosure, the recirculation intervals per motor phase or, however, the recirculation intervals from phase to phase of the motor will be compared with each other and respectively set into relationship with each other. As long as the naturally existing variations of the recirculation intervals are within expectation value ranges, it can be assumed that the electric motor is operating without faults. In case of changes of the recirculation intervals, this—optionally after further procedures—can be considered as an initial indication of a possible faulty load condition of the motor. The exact form of the reaction on a first indication detected in this manner (e.g. switch-off of the electric motor, setting the electric motor into a different operating mode for protection of the motor against threatening destruction etc.) is generally not part of the subject matter of the disclosure. Further, it is generally only of secondary importance for the disclosure after which time interval from the first detection of a possibly existing faulty load condition a reaction is to take place, and in which form this will be done.

By the formation of the relationships of the recirculation intervals succeeding each other over the motor phases, or of the relationships of the recirculation intervals succeeding each other per phase of the motor, values are computed which will be compared to an expectation value and respectively expectation value range. If the computed values are within an expectation value range, it will not be assumed that a faulty load condition could exist.

The disclosure has to be seen particularly in view of the trend that, for the driving of multi-phase electric motors or other inductive loads, increased use is made of low-ohmic power transistors. These power transistors can be produced at such low expense that their total costs for the overall system are lower than in a case where e.g. a cooling body would be used for cooling conventional power drivers which have a higher $R_{SDON}$. A further advantage of the use of modern low-ohmic power transistors is to be seen in the simplified installation of the electronics due to the lower power loss of these power transistors. Further, viewed in the total energy balance, the $CO_2$ exhaust is reduced. However, because of the low-ohmic power transistors, the voltage drops in case of a short circuit are, due to the low $R_{SDON}$, so small that the occurrence of a short circuit cannot be reliably detected anymore with the aid of the currently available means. Therefore, one uses distinctly more-sensitive short-circuit threshold values in order to meet the changed demands caused by low-ohmic power transistors. On the other hand, these solutions to the problem are not suited to detect all cases of short circuits. Particularly in view of BLDC and DC bridge driver ICs and stepper motor driver ICs, the disclosed solution has clear advantages because, as a result of the high demand for such driver ICs, it would quickly become established on the market.

The expectation values and respectively expectation value ranges are suitably determined empirically. In this respect, it can be provided that the expectation values for maximally allowable deviations where it is not yet desired that a faulty load condition is detected, are obtained, by training, on one or a plurality of pre-aged reference systems with fault-free load condition, i.e. the typical values are detected and, provided with selectable additional allowable tolerances, are deposited in the drive unit as a maximum allowable expectation value range, and/or that the expectation values for maximally allowable deviations where it is not yet desired that a faulty load condition is detected, are—after production—obtained, by training, on each motor system for itself with fault-free load condition, i.e. the typical values are detected and, provided with selectable additional allowable tolerances, are deposited in the drive unit as a maximum allowable expectation value range, and/or that the expectation values for maximally allowable deviations where it is not yet desired that a faulty load condition is detected, are, in the course of the lifespan of the motor, provided with higher tolerances, and/or that the detected faulty load condition will be generated by deviation of the commutation angle from the target range and that the drive unit will compensate for the error by adaptation of at least one of the two drive parameters "amplitude" and "phase".

According to an advantageous example of the disclosure, it can be provided that, from the type of the deviations from the expected value ranges for the individual motor phases among each other, conclusions are drawn on the type of the faulty load condition such as e.g. shunt of motor phase toward motor phase, shunt of motor phase toward ground, shunt of motor phase toward supply voltage, too high-ohmic motor phase connection (possibly caused by contacting problems in plugs), loose contact of a motor phase, faulty driver resistances of individual high-side or low-side drivers (optionally only in case of certain load conditions), and/or conclusions are drawn, for each individual motor phase in sequential order, on faulty load conditions such as e.g. a loose contact, a mechanical defect, play of a bearing, malfunction in the transmission, or a mechanical error in the application, wherein the frequency of the sequentially occurring deviations can provide a conclusion on the exact site of the fault.

For classification of the deviation of the respective parameter from the corresponding expectation value or range, use can be made of methods for statistical pattern recognition by which operational states of the electric (stepper) motor can be classified so that defined measures can be taken for minimizing the effects of a fault and for prognosticating the future effects of a fault on the motor. In doing so, the prognosis can be given in the form of possible future operational states to which there are assigned likelihoods and/or valuation numbers (e.g. effect evaluations).

Herein, there can be performed one or a plurality of the processing steps listed hereunder:

a) Formation of a feature vector from a plurality of values of the deviations that are detected simultaneously and/or sequentially, wherein the feature vector can comprise simple and higher derivatives and/or simple and higher integrals of these values and/or other magnitudes derived from these values as well as other magnitudes from other sensor systems.

b) Multiplication of a feature vector by a linear discriminant analysis (LDA) matrix into a modified feature vector for increasing the selectivity.

c) Comparison of the modified feature vector with prototypical vectors, i.e. the operating state prototypes which have been stored particularly in a prototype database, wherein the result of the comparison is a binary and/or digital and/or analog distance value between the modified feature vector and the respective prototypical vector per evaluated prototypical vector.

d) Selection of at least one operating state prototype of said database on the basis of a distance value, there being selected particularly the operating state prototype with the smallest distance value and/or the operating state with the most massive effect and/or with the most massive effect evaluation.

e) Output at least one of the selected operating state prototypes.

f) Optionally, output at least one of the distance value which is assigned to the feature vector relative to the selected operating state prototype, and/or a value derived therefrom.

g) Optionally, output of further selected operating state prototypes and associated distance values and/or value derived therefrom, for output of a hypothesis list which typically also comprises the selected operating state prototype and its distance value.

h) Optionally, detection of the most likely chain of operating state prototypes and prognosis of at least one following prognosticated operating state or of a prognosticated operating state sequence.

i) Optionally, initiation of measures on the basis of the selected operating state and/or the detected hypothesis list and/or the prognosticated operating state or the prognosticated operating state sequence.

Alternatively to the per se known basic methods of statistic pattern recognition, the processing of the deviations of the respective parameter from the expectation value or range associated thereto can be performed by use of neuronal networks and/or Petri nets and/or fuzzy logic and/or a Viterbi algorithm.

According to an advantageous example of the disclosure, it can further be provided that, instead of the amount of a current, there is measured an electrical parameter representing the amount of the current, e.g. a voltage drop across an electric/electronic component, particularly across a shunt resistor or a transistor which particularly is a high-side and/or a low-side switch.

Further, it can be suitable if, in the high-ohmic motor phase, the time measurement is terminated by a comparator when the voltage of the motor phase rises above or falls below a preset comparator threshold value.

It can be of advantage if, onto the actual high-ohmic motor phase, there is applied a preset test current opposite to the recirculation current, wherein, in accordance with this test current, the voltage change is performed at the phase connection upon reduction of the recirculation current to the set test current.

It can be advantageous if the time measurement unit operates linearly, i.e. with constant counting speed.

Further, it can be of advantage if the time measurement unit operates logarithmically.

According to an advantageous example of the disclosure, it can be provided that the time measurement is stopped between the individual intervals of a high-ohmic operating state.

According to an advantageous example, it can further be provided that the time measurement continues between the individual intervals of a high-ohmic operating state.

It can be advantageous if, instead of the described exact time measurement, there is performed, merely at a fixed time point after start of a high-ohmic operating state, an examination for an exceeding or falling-short of the presettable comparator threshold value and, in accordance therewith, the time measurement is performed in the thus generated resolution (number of PWM cycles in a high-ohmic operating state).

Further, it can be of advantageous if, instead of the time interval between said measurement start time points in the switching scheme and the reaching of the current threshold values, there are measured the time intervals between the individual instances of exceeding or falling-short of the comparator threshold values, and that the time intervals of the individual motor phases are compared among each other and/or the time intervals of each motor phase for itself are compared in temporal succession, or are compared to an expectation value valid for fault-free operation of the motor, wherein a deviation of the amount of the present time intervals among each other and/or from the expectation value is evaluated as being an indicator of the existence of a faulty current.

As compared to the state of the art, the use of the disclosed method results in an increased reliability of the detection of faulty load conditions, which is achieved by improved useful signals and an improved performance of the detection method. The detection threshold value for the existence of a faulty load condition (e.g. short circuit) is not dependent anymore on the amount of the maximum current allowable in operation. Further, the method can be implemented in an inexpensive manner.

The disclosure has to be seen particularly in view of the trend that, for the driving of multi-phase electric motors or other inductive loads, increased use is made of low-ohmic power transistors. These power transistors can be produced at such low expense that their total costs for the overall system are lower than in a case where e.g. a cooling body would be used for cooling conventional power drivers which have a higher $R_{SDON}$. A further advantage of the use of modern low-ohmic power transistors is to be seen in the simplified installation of the electronics due to the lower power loss of these power transistors. Further, viewed in the total energy balance, the $CO_2$ exhaust is reduced. However, because of the low-ohmic power transistors, the voltage drops in case of a short circuit are, due to the low $R_{SDON}$, so small that the occurrence of a short circuit cannot be reliably detected anymore with the aid of the currently available means. Therefore, one uses distinctly more-sensitive short-circuit threshold values in order to meet the changed demands caused by low-ohmic power transistors. On the other hand, these solutions to the problem are not suited to detect all cases of short circuits. Particularly in view of BLDC and DC bridge driver ICs and stepper motor driver ICs, the disclosed solution has clear advantages because, as a result of the high demand for such driver ICs, it would quickly become established on the market.

DESCRIPTION OF THE DRAWINGS

The disclosure will be explained in greater detail hereunder by way of examples and with reference to the drawings. In the individual views of the drawings, the following is shown.

DESCRIPTION

The disclosure is based on the recognition that, when driving inductive loads such as e.g. electric motors, it is detected by means of a comparator whether a transistor in the switched-on state comprises a positive voltage drop (in case of load) or a negative voltage drop (in case of inductive feedback).

This is an indicator of the direction of the current flow through this driver (switch). In inductive loads such as e.g. motors, the time point of the reversal of the current direction is of course determined, on the one hand, by the modulation of the driving of the motor but, on the other hand, by the behavior of the coil current which, as is known, follows the modulated voltage. The expectation value as to when a change from a positive to a negative voltage drop should take place, i.e. when the current through the respective driver has sunk to zero, is preset by the PWM modulation of the motor and by the motor parameters.

If, now, the site of the change of sign of a connection (motor phase) deviates in a reproducible manner from that of the other connections (motor phases) or from predetermined expectation values, there has to be assumed a fault situation in the motor or the connections, particularly if, when observing these changes of sign over time, the individual motor phases differ from each other in an atypical manner. The type of the deviation is an indicator as to whether, and at which connection, which kind of short circuit (shunt after ground or toward the positive supply potential) or which kind of a high-ohmic state exists.

In the individual case, it can be sufficient to monitor only the low-side drivers or only the high-side drivers as has been explained above. In case of a corresponding sensitivity of the measurement device, the above described signals can also be used for the commutation of the motor.

Figure 1:
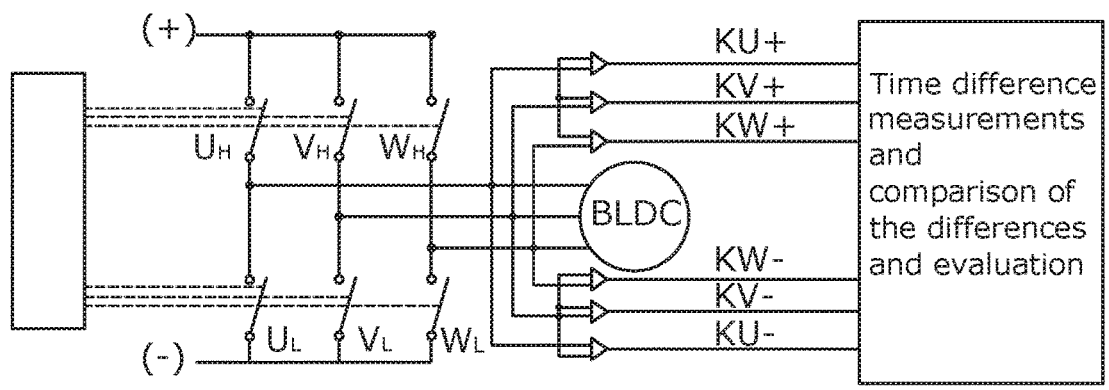
FIG. 1 shows an option for the circuitry for a three-phase electric motor of a generally freely selectable design.

A possible switching scheme for a three-phase electric motor with electric commutation is shown in FIG. 1. The motor BLDC is driven by a driver full bridge, wherein each motor phase U, V and W has assigned to it a switch pair comprising a high-side switch $U_H$, $V_H$ and respectively $W_H$, and a low-side switch $U_L$, $V_L$ and respectively $W_L$. The voltage drop across each switch is monitored by means of the comparators $KU_H$, $KV_H$, $KW_H$, $KU_L$, $KV_L$ and $KW_L$. In this arrangement, each motor phase U, V and W has assigned to it a comparator or a pair of comparators. With the aid of these comparators, it is possible to detect when the direction of a current flowing through a switch is reversed. Thereby, the zero crossing of the current through a switch can be detected. Owing to the construction and the driving, the zero crossing is within an expectation value range (expectation time slot). By examining the time points of the zero crossings as seen across a plurality and respectively all of the motor phases, and respectively as seen within one motor phase, it will then be possible to conclude on faulty load conditions. In as far as the time points of zero crossings—that naturally deviate from phase to phase or within a phase—follow a reproducible pattern, this can be brought into connection with design-inherent asymmetries of the motor and the following loads. Non-reproducible and particularly non-predictable deviations of the time points of zero crossings from the expectation value ranges allow for conclusions on faulty load conditions. Thus, such deviations have to be interpreted as being a first indicator of a faulty electrical or mechanical load condition of the motor.

Figure 2:
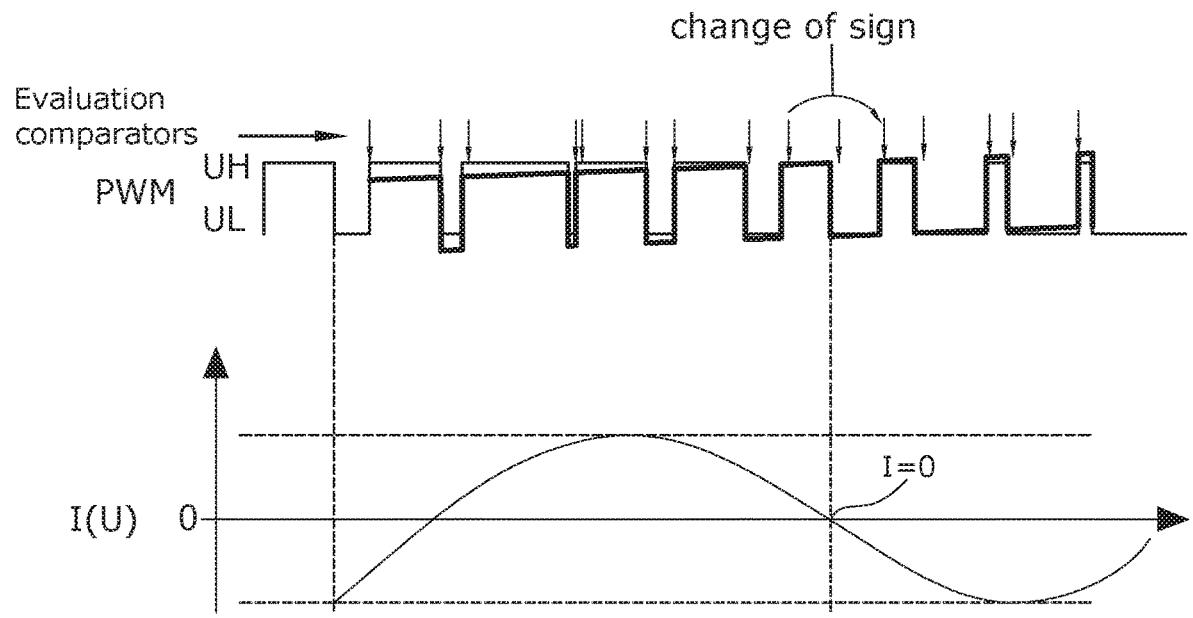
FIG. 2 illustrates, in partial view, a sinus or space vector commutation in the region of the sign change of the current flowing through a driver.

FIG. 2 shows a commutation option for a multi-phase electric motor. In the present case, there is illustrated a sine and respectively space vector commutation, notably within that portion of the commutation development in which the current-direction sign change—in this example, of the phase U—occurs. The thin curve in FIG. 2 represents the theoretical voltage in a situation where the driver switches are driven with a randomly selected low-ohmic value. The thicker curve represents the voltage development under consideration of the voltage drop across the respective driver switch.

The basis of the disclosure is the detection of temporal differences between respective fixed time points in the commutation scheme and the respective present time point of reaching a specific voltage drop across the individual drivers. The fixed time points should suitably be situated before a zero crossing. A special case herein is the reaching of the current I=0, which corresponds to a voltage drop of 0 Volt. However, also any other current value which will be reliably reached during the commutation can be used as a trigger point for the end of the time measurement. There is also possible a detection of the temporal differences before reaching the desired voltage threshold values in a motor connection until reaching the same conditions in the next motor connection. In this case, there exists no fixed starting time point for time measurement.

A preferred variant for carrying out the detection of the recirculation time interval resides in a logarithmic time measurement. The logarithmic time measurement follows a function that is approximated to a logarithm, notably in such a manner that the speed of the counter will decrease with increasing counting time. This has the following advantages:

a) Long and short time periods can be detected with the same relative precision. There is no unnecessarily high accuracy in measurements of large absolute time periods.
b) The number of bits to be evaluated per measurement value is drastically reduced.
c) Due to the logarithm formation, the detection of time relationships which normally require a "multiplication-or-division"-type calculation can be realized by an "addition-or-subtraction"-type calculation. This will reduce the hardware and software expenditure in the comparison operation.
d) It is possible to perform a less expensive realization of the evaluation either by a smaller logic and/or by a CPU-time-saving realization in a controller.

Figure 3:
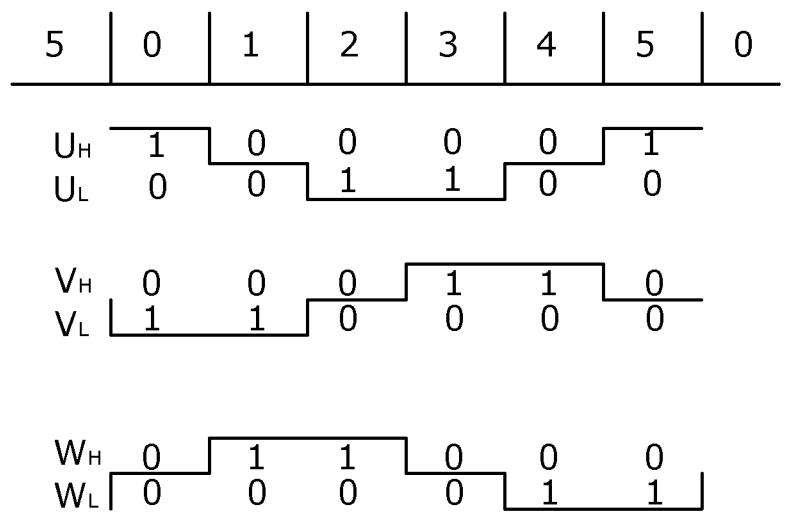
FIG. 3 illustrates, by way of example, a block commutation of a three-phase motor.

FIG. 3 shows, by way of example, the current feed scheme in a block commutation of a three-phase motor of a generally freely selectable design. However, the method of the disclosure is also applicable in sine or space vector current feed or in similar modulation types and, apart therefrom, also for other motor types such as e.g. bipolar or unipolar stepper motors.

It is common to the described circuitries and motors that, according to the disclosure, the present current is measured at fixed phase angles (relative to 360° per electric rotation) and that the current measurement values of the different connections are compared to each other at the same individual phase angle of the corresponding connection. At different time points where the previously set fixed phase angle relationships exist, the currents and respectively currrent relations of the various connections relative to each other are compared to each other for reproducible deviations from the expectation value range. Asymmetrically designed motors can e.g. lead to different expectation value ranges which are not identical for all phases. The method of the disclosure provides a possibility to compensate for this effect. Further, it is provided that, in such motors, the expectation value ranges can be adapted also beyond one mechanical rotation which can comprise a plurality of electrical rotations by 360°. Thereby, when applying the disclosed method, high precision and protection from faulty activations is obtained in all motor types. Illustrated in FIG. 3 are the switch-on and switch-off states of the high-side and low-side drivers $U_H$, $V_H$ and $W_H$ as well as $U_L$, $V_L$ and $W_L$ of the three motor phases U, V and W. By analysis of the currents and current relationships using the disclosed method, it is achieved that

- already small, permanent and reproducible asymmetries are an indicator of possible faulty currents,
- temporary asymmetries that are generated as disturbances, e.g. due to load change variations or variations on the current feed level or due to "loose contacts", can be separated, by means a downstream-connected logic, from the faulty currents which may lead to an inadmissibly high stress and damage of the electronics,
- in case of a faulty current W after a positive supply potential, dV will increase in the state $W_{LON}$ and then, in the state $W_{HON}$, no influence will exist anymore, and
- in case of a faulty current W after V, dV will be higher in comparison to other combinations, notably in the states $W_{HON}$ and $V_{LON}$, or also $W_{HON}$ and $V_{HON}$.

Figure 4:
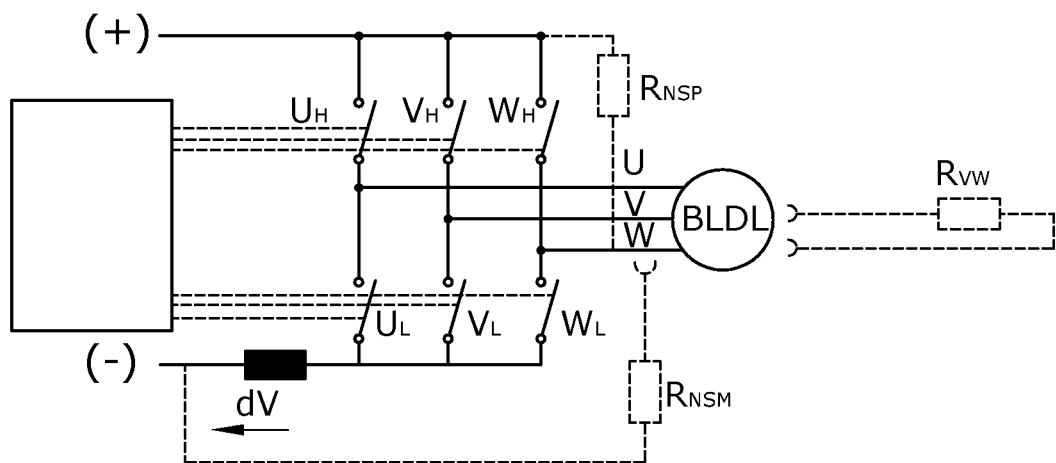
FIG. 4 shows the circuitry of an exemplary three-phase motor in the special case that no individual current measurement devices exist for all motor connections.

FIG. 4 shows a circuitry option for three-phase motors of a generally freely selectable design for the special case that, for none of the motor connections, there exists an individual current measurement device assigned to it. The three-phase motor can be e.g. a BLDC or a stepper motor.

In FIG. 4, the high-side drivers and the low-side drivers assigned to the three motor phases U, V and W are designated by $U_H$, $V_H$ and $W_H$ and respectively by $U_L$, $V_L$ and $W_L$. The motor itself is designated by BLDC. Represented by interrupted lines are three potential events that generate a faulty current, notably a faulty-current-generating shunt of the phase W toward ground (see at $R_{NSM}$), a faulty-current-generating shunt of the phase W toward the positive supply potential (see at $R_{NSP}$), and a short circuit between the phases V and W (see at $R_{VW}$). In this exemplary embodiment, the only current measurement device is arranged in the low-side driver path and is represented by a shunt $R_{Shunt}$. Alternatively, however, the shunt resistor could also be arranged in the high-side path. Instead of a shunt resistor, there can also be used any other current measurement device. It is considered to be particularly advantageous if the current measurement is performed under consideration of the voltage drop across the drivers.

Figure 5:
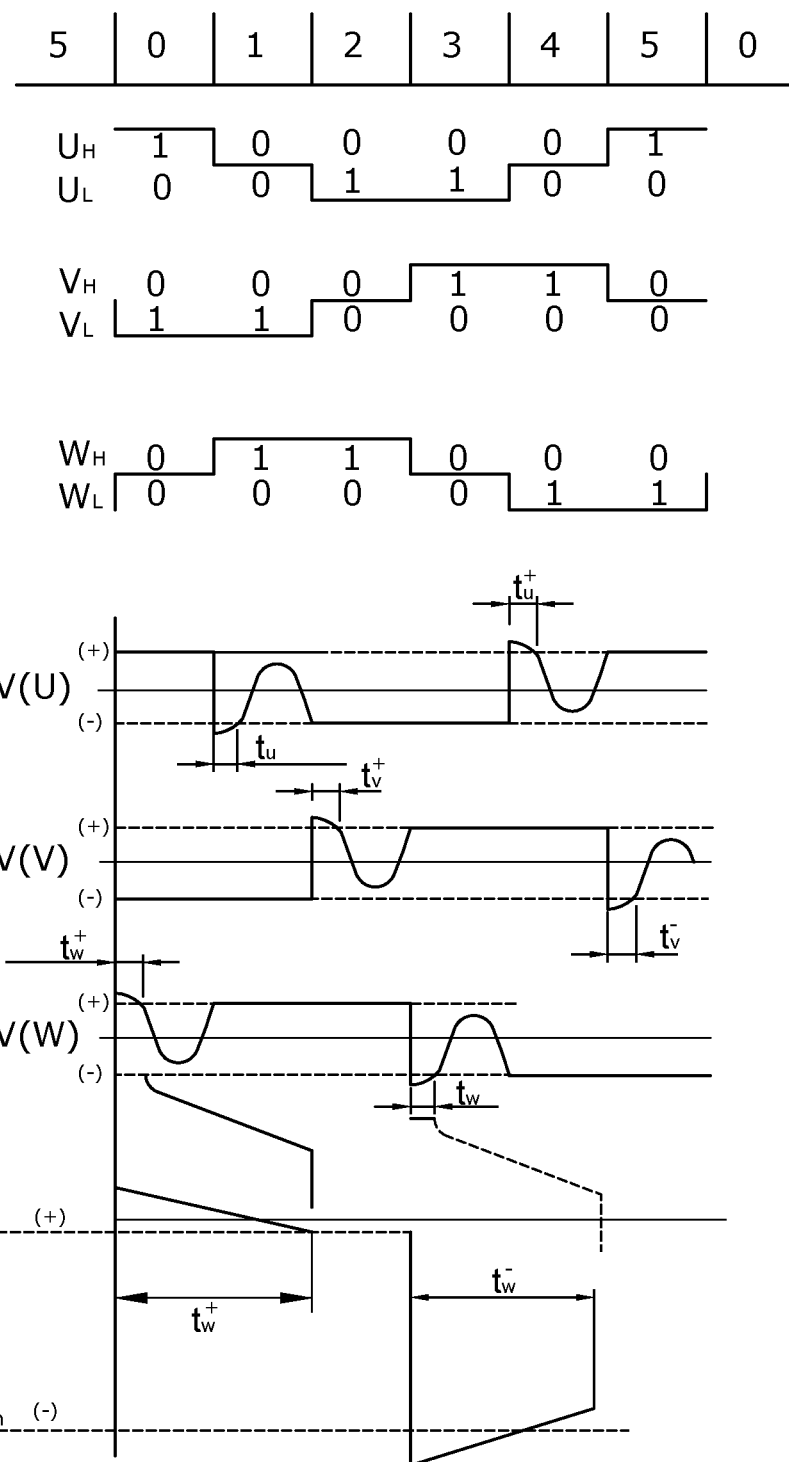
FIG. 5 shows an example of a switching scheme (in this case for a three-phase motor) wherein the switching scheme does not include high-ohmic phases.

FIG. 5 shows a switching scheme which includes a high-ohmic phase, as exemplified by a (random) three-phase motor. The individual intervals of a switching cycle are designated as phases 0 to 5. The high-side and low-side switches are designated in the same manner as in the previous Figures. The voltage developments of the three phases are designated by V(U), V(V) and V(W), wherein, in the two lowermost diagrams, the correspondingly marked transition ranges of the voltage V(W) of the phase W are represented on an enlarged scale.

According to this variant, possible time points of the current measurement are time points where no direct current portion is flowing through a motor connection. Detection options with respect to such time points are:

a) all detection time points of a possibly existing BEMF (back EMF) signal (see V(U),V(V), V(W) curves in FIG. 3), b) the aspect as to whether the signal is within the limits $V_{th+}$ and $V_{th-}$, whereby, thus, the reaching of the threshold value $V_{th+}$ or $V_{th-}$ is used as a timer (see the enlarged representation in the two lowermost diagrams of FIG. 3), c) it being possible to add suitable times to the time points under a) and b) before the measurements are initiated, wherein, at the time points according to a), b) or c), the current is detected at least at one of the other motor connections.

The current values of suitable phases of the commutation scheme are compared to each other. The differences or relationships of the current values relative to each other will be examined for reproducible, repetitive deviations and will be evaluated as described above.

Figure 6:
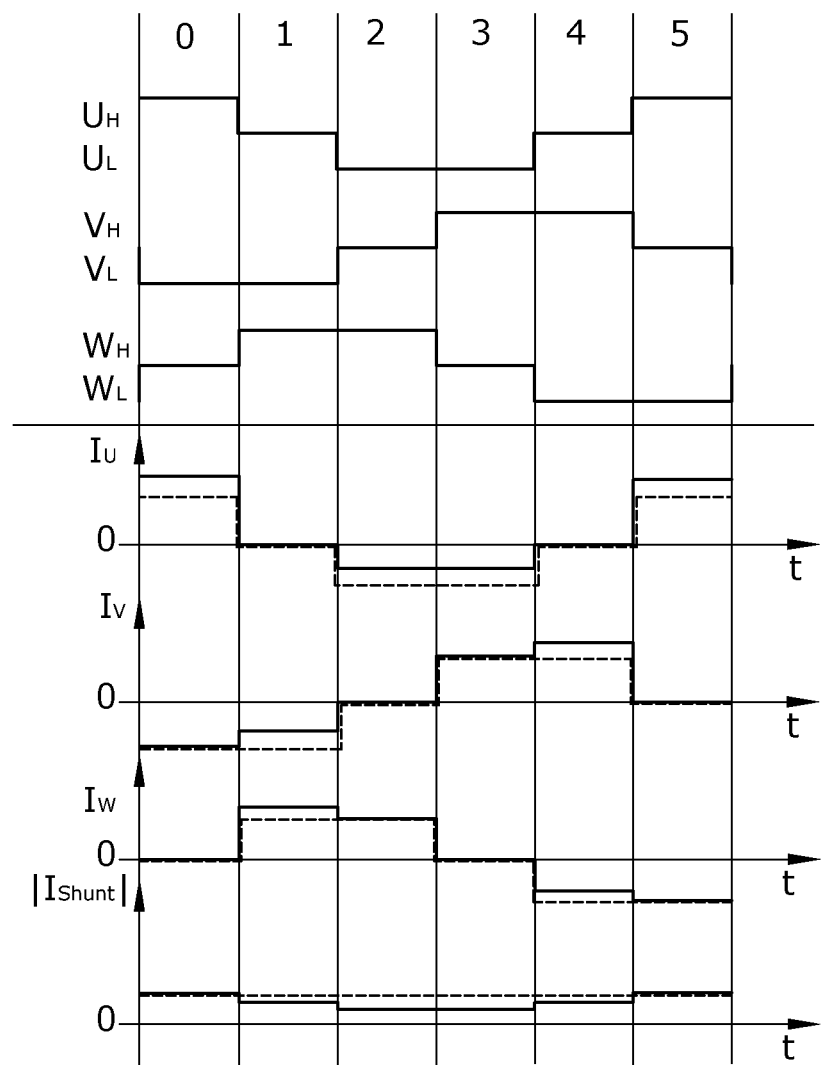
FIG. 6 shows illustrations of the effects of a fault situation on the current measurement in case of a faulty current against ground.
Figure 7:
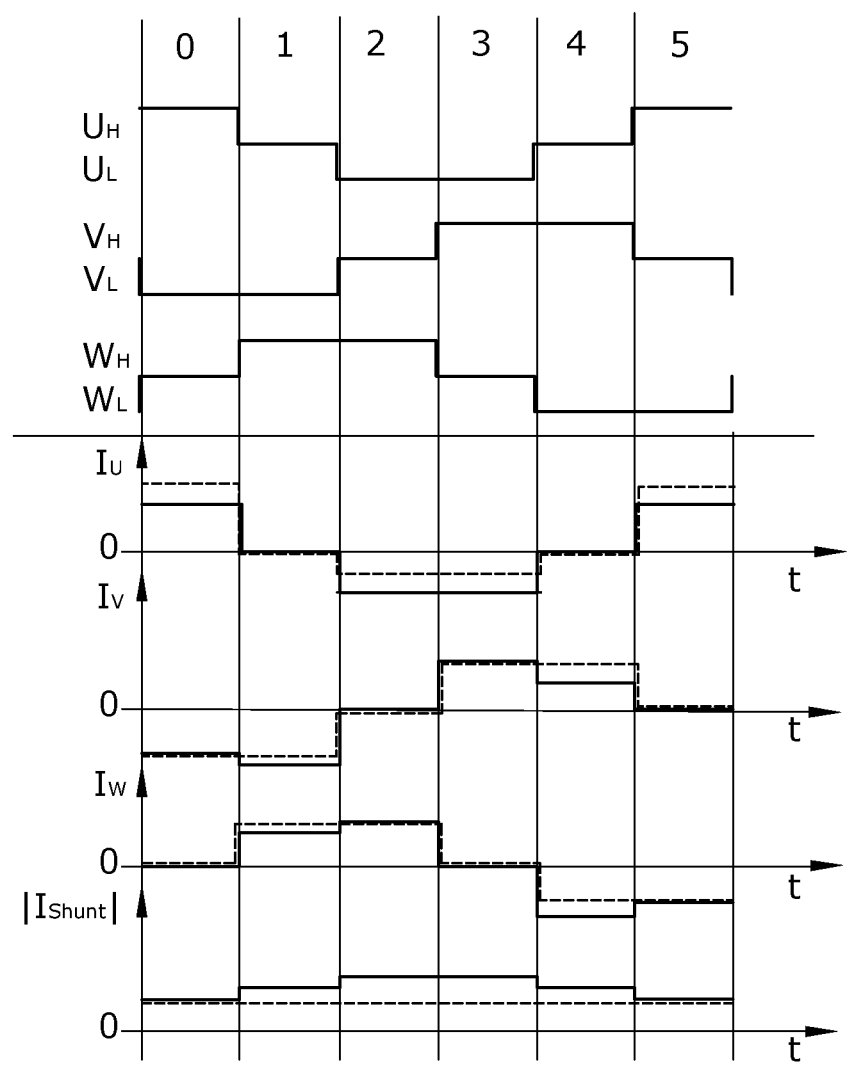
FIG. 7 shows illustrations of the effects of a fault situation on the current measurement in case of a faulty current against the positive supply potential.

In FIGS. 6 and 7, there are shown—under the assumption of the scheme of the block commutation as already described above—the effects that a fault condition has on the current measurements. In this regard, it is assumed that, for none of the motor connections, there exists a separate current measurement device (see the situation according to FIG. 4). The individual current developments of the phases U, V and W and across the shunt resistor are shown in the respective lower part of FIGS. 4 and 5 at $I_U$, $I_V$, $I_W$ and respectively $I_{Shunt}$. The time points where, per phase, the current across the shunt resistor is detected, are designated by $T_{Shunt}$.

Shown in FIG. 6 is the fault case of a faulty current of the phase U toward ground. Without such a shunt of the phase U toward ground, there will occur, in the current measurement time periods and also in the other time periods, a respective phase current development according to the interrupted line, while the shunt will lead to a current development as shown in the lower part of FIG. 6 by a continuous line.

FIG. 7 shows a corresponding situation, there being represented here the fault case of the shunt of the phase U against the positive supply potential. Without such a shunt, there will occur the current development represented by the interrupted lines, and the shunt case will result in the current development represented by the continuous line on FIG. 7. $T_{Shunt}$ in turn designates the current measurement time periods.

Figure 8:
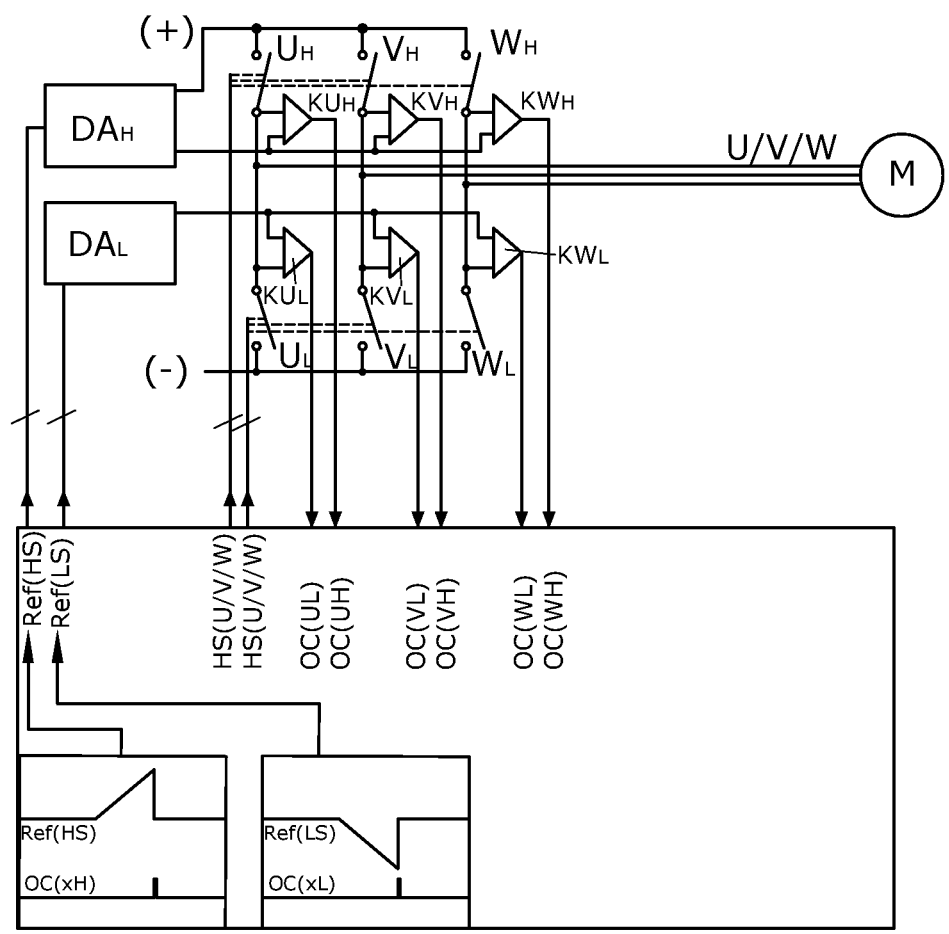
FIG. 8 shows a further option for the circuitry for a three-phase motor of a freely selectable design, provided with drain-source voltage monitoring devices on the high-side and low-side switches, wherein these voltage monitoring devices can be used in a phase-wise manner for the present current measurement.

FIG. 8 shows the case of a circuitry option for a (random) three-phase electric motor M with the phases U, V and W wherein a current monitoring device SU is provided for each high-side and each low-side switch. Each current monitoring device comprises a comparator which is respectively assigned to one of the driver switches. Thus, the group of high-side switches $U_H$, $V_H$ and $W_H$ have assigned to them the comparators $KU_H$, $KV_H$ and $KW_H$ which together, via a digital/analog converter $DA_H$, receive a digital reference value Ref(HS) against which the current will be compared. In a similar manner, the two low-side switches $U_L$, $V_L$ and $W_L$ have assigned to them a separate comparator $KU_L$, $KV_L$ and $KW_L$, which again, via a common digital/analog converter DA, will receive a digital reference value Ref(LS) against which the current will be compared. A control unit SE is operative to drive the digital/analog converters $DA_H$ and $DA_L$. Also the high-side switches and respectively the low-side switches are driven, each time together as a group, by the control unit SE. Via the outputs of the capacitors, the control unit SE receives signals which possibly indicate an overcurrent flowing through one of the switches. Each time the drivers are switched on, the references Ref(HS) and Ref(LS) will be set to their usual short-circuit detection value so as to be able to detect low-ohmic short circuits in the usual manner.

The digital/analog converters $DA_H$ and $DA_L$ are subsequently used, together with the overcurrent comparators $KU_H$, $KV_H$, $KW_H$ $KU_L$, $KV_L$ and $KW_L$ with the output signals OC(x), as current measurement devices. At a suitable measurement time point, as described above, the amounts of the references are successively reduced. The value Ref(HS) or Ref(LS) which then will sooner or later lead to activation of a comparator OC(x), is further processed as a current measurement value. In the process, no driver switch-off occurs, while, conversely, after activation of the comparator, the usual overcurrent threshold value (short-circuit protection) will again be activated at Ref(HS) and respectively Ref(LS). Thus, if a short circuit should occur during the reduction, then a) the respective comparator would be immediately activated,
b) immediate switch-over to the normal short-circuit detection threshold value would be performed, and
c) a subsequent short-circuit switch-off would be performed.

In FIGS. 9 and 10, this is again graphically represented, by way of example of current developments on a high-side driver, for the case that no short circuit occurs during the current measurement (FIG. 9) and for the case that a short circuit does occur during the current measurement (FIG. 10).

Figure 9:
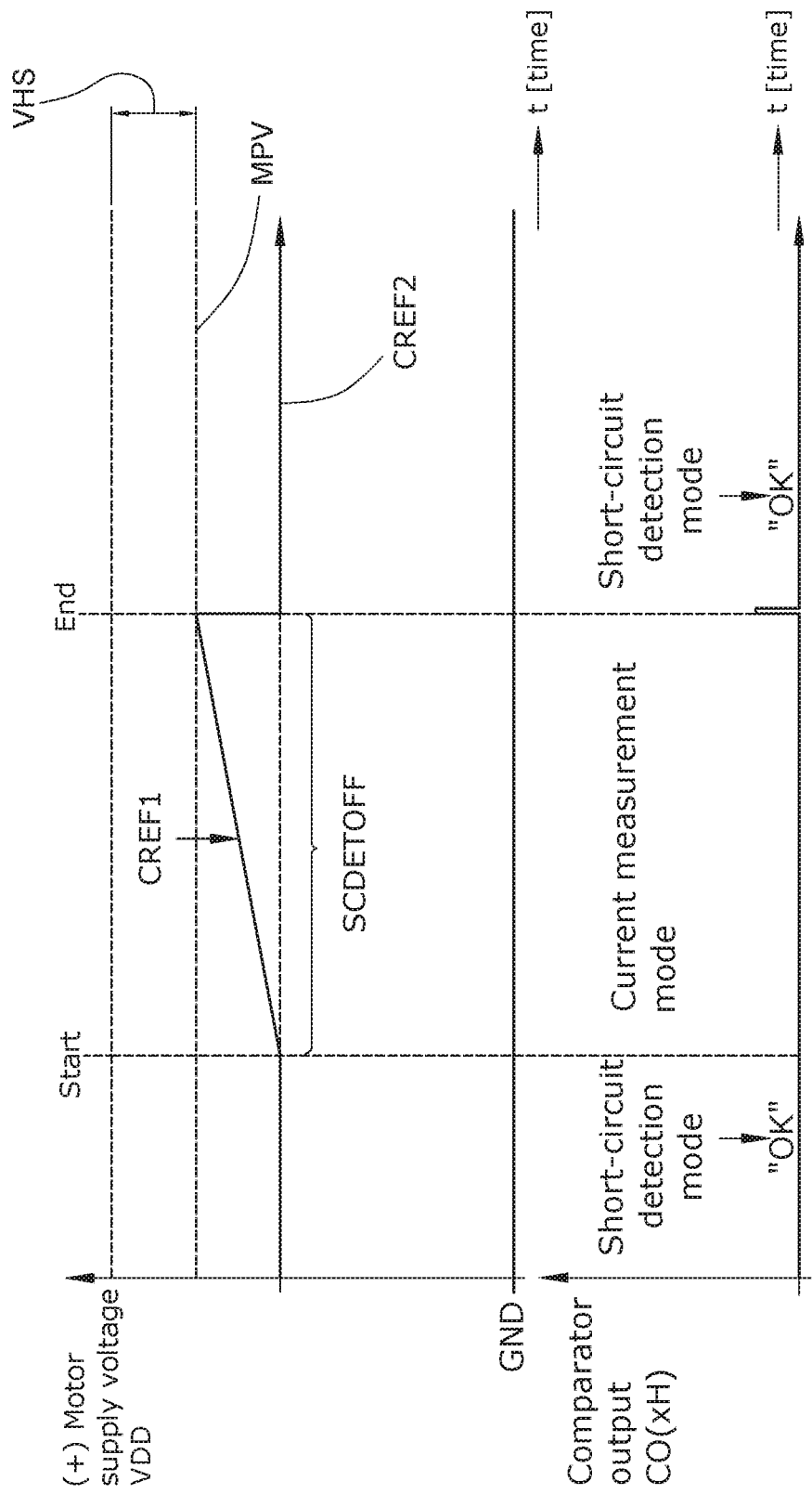
FIGS. 9 and 10 show diagrams-explaining information on the switching option according to FIG. 8 respectively for the case that no short circuit occurs during current measurement (FIG. 9) and for the case that a short circuit does occur during current measurement (FIG. 10)

FIG. 9 illustrates voltage developments of a high-side driver in a normal case without short circuit detection during current measurement, including (a) storing the present value of the comparator reference as a current measurement value and (b) reactivation of the normal function as overcurrent detector. (Start) indicates a beginning of the current measurement and (End) indicates an end of the current measurement. VHS indicates a voltage drop across high-side driver. SCDETOFF indicates a phase during which short-circuit switch-off is deactivated. CREF1 represents a ramp-shaped driving of the comparator-reference ($D_{AH}$). CREF2 represents the comparator reference ($D_{AH}$) in the short-circuit detection mode. MPV is the motor phase voltage (U/V/W) without short circuit against ground.

Figure 10:
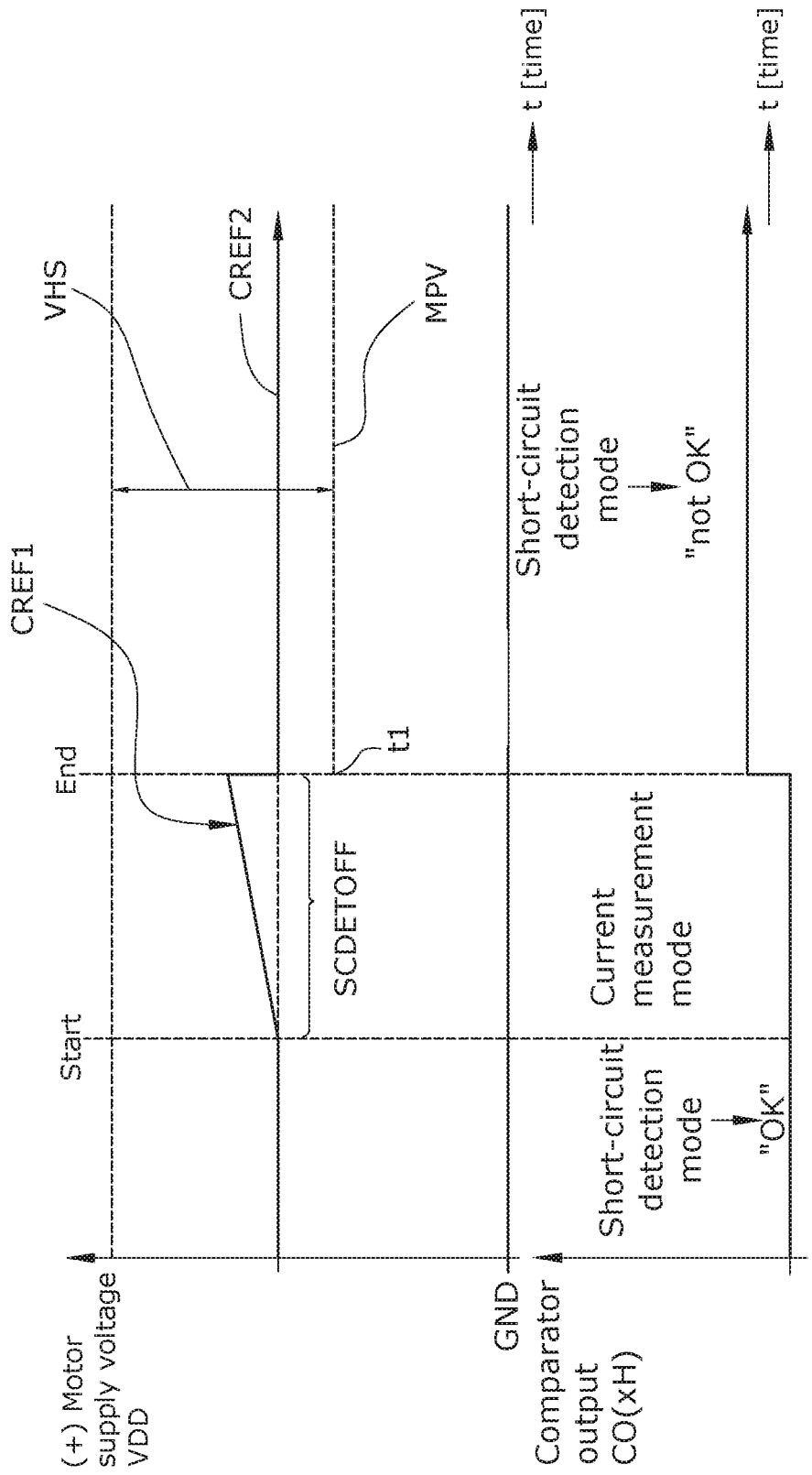

FIG. 10 illustrates voltage developments of a high-side driver in a short circuit case, i.e., there is a short circuit during current measurement. In this case, switching of the comparator effects reactivation of the shot circuit switch-off, which will then immediately detect that a short circuit exists. (Start) indicates a beginning of the current measurement and (End) indicates an end of the current measurement. VHS indicates a voltage drop across high-side driver. SCDETOFF indicates a phase during which short-circuit switch-off is deactivated. CREF1 represents a ramp-shaped driving of the comparator-reference ($D_{AH}$). CREF2 represents the comparator reference ($D_{AH}$) in the short-circuit detection mode. MPV is the motor phase voltage (U/V/W) without short circuit (high ohmic against ground).

The described method requires that its components have sufficient dynamics so that the delays in case of a short circuit will not be inadmissibly high. The advantage of using the overcurrent monitoring devices for current measurement (see FIGS. 6 to 10) is to be seen in the cost reduction effected by two-fold use of existing components while, at the same time, the overcurrent monitoring is free of interruptions. A preferred variant for carrying out the change of the switching threshold values of the comparators of the overcurrent monitoring devices is to be seen in a generator for the respective reference value which, within the downward ramp, includes a functionality approximated to a logarithm, such that the reference value from one step to the next will be reduced by a certain percentage. The advantage of this approach is that the ramp can be traveled through at a distinctly faster speed while the relative accuracy remains the same, which will allow for a measurement with shorter duty-cycle times. The number of bits to be evaluated per measurement value is drastically reduced. The "multiplication-or-division"-type calculation which is normally required for detection of the current relationships can, because of the logarithm formation, be imaged by an "addition-or-subtraction"-type calculation. It is possible to practice the evaluation in a cost-saving manner either by a smaller logic or by realization in a controller that will save CPU working time.

If a switching scheme of a multi-phase inductive load (e.g. a multi-phase electric motor) includes intervals with high-ohmic final stages or if it is feasible to integrate these intervals into a switching scheme of a multi-phase inductive load, it is possible, when a load connection has been switched to a high-ohmic state, to detect, by means of a simple comparator, the time point of the sign change of the current after the high-ohmic switching state. In case that, in the switching scheme, there are usually no high-ohmic motor phases, the method of the disclosure provides that these be inserted shortly before the site where the value of the respective current reaches zero. The recirculation time as measured in accordance with the disclosure is a measure of the current existing in the inductive load (motor winding) at the time point of switching into the high-ohmic state, and also of the inductivity of the motor connection. Here, one can either compare the time points to the default values preset by the PWM control or, preferably, one can measure the time periods between the switching into the high-ohmic state and the activating of the comparator with respect to specific PWM combinations and compare the time measurements of the individual motor phases to each other.

If the results of these comparisons deviate from expectation values, the type of the deviations allows for conclusions on different causes for faulty currents. Motors of an asymmetrical design can lead to expectation values which include asymmetries.

Further, the expectation values may vary across a plurality of electric movement cycles, e.g. when a multi-pole motor has to pass through a plurality of electric cycles to perform a mechanical rotation. Here, one may obtain a cyclical pattern of comparative values (i.e. expectation values).

Without faulty currents, said patterns of comparative values should occur. In case of shunts or other errors, the relations of the recirculation times relative to each other will deviate from the expectation values. With corresponding sensitivity of the measurement device, the above described signals can also be used for commutation of the motor. This can be realized to a large part by compact digital technology.

Figure 11:
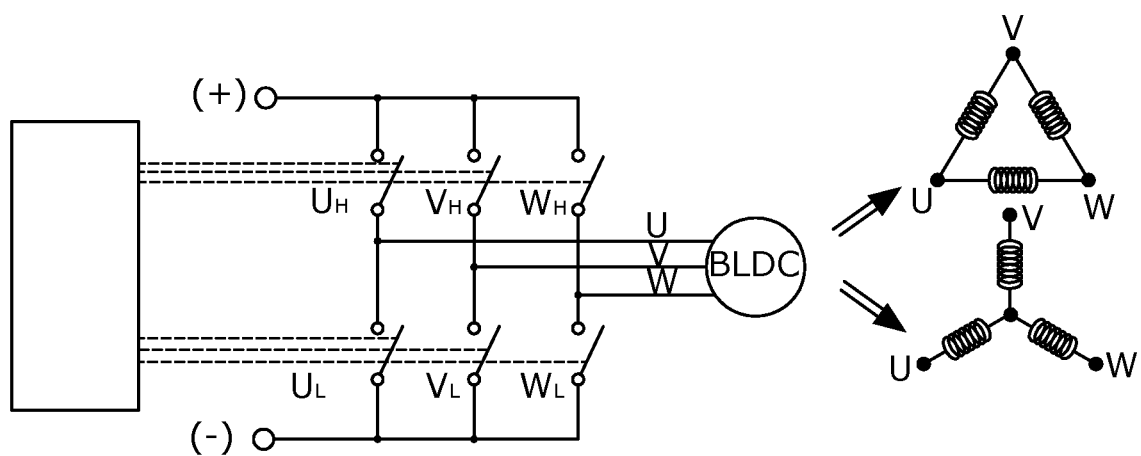
FIG. 11 shows an option for the circuitry for driving a multi-phase (in the exemplary embodiment, three-phase) electric motor of a generally freely selectable design.

FIG. 11 shows an example of the circuitry of an electric motor—in the present embodiment, a three-phase electric motor—with the aid of a full bridge which comprises high-side switches $U_H$, $V_H$ and $W_H$ respectively assigned to the three phases U, V and W, and three low-side switches $U_L$, $V_L$ and $W_L$ respectively assigned to these phases. The electric motor is designated by BLDC (brushless DC) and can be run e.g. in star or delta operation.

Figure 12:
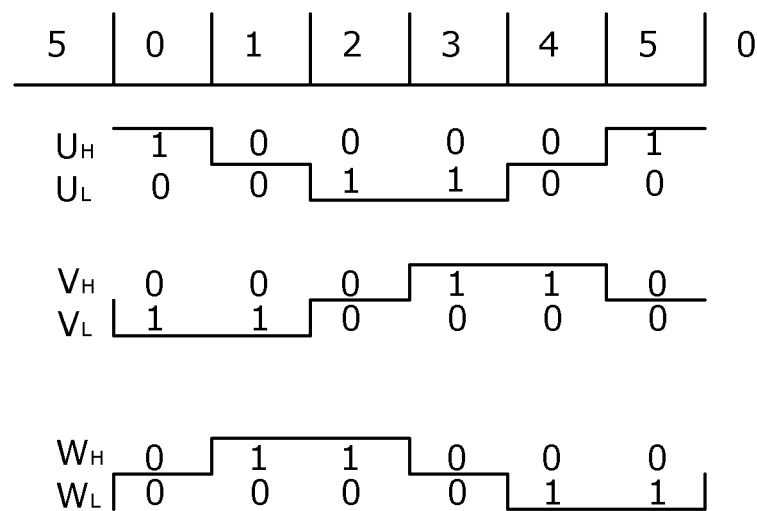
FIG. 12 shows an example for the block commutation of an e.g. three-phase motor type (e.g. according to FIG. 11)
Figure 12:
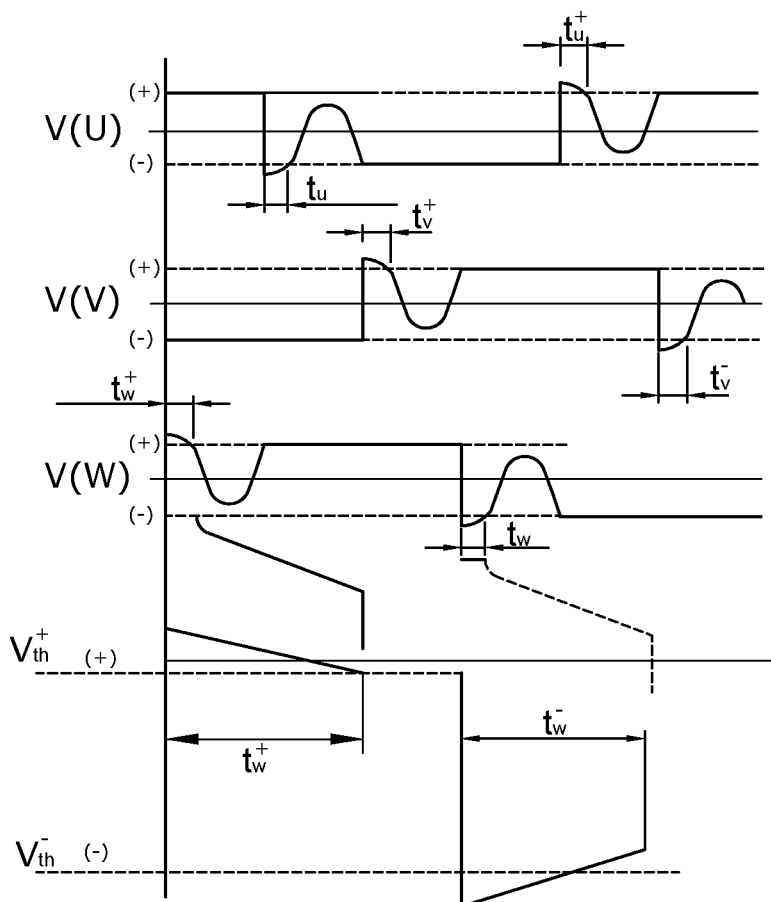

A possible block commutation for such a three-phase motor with a circuitry according to FIG. 11 is shown in FIG. 12. The individual portions of an electric rotation by 360° are designated by 0 to 5. In FIG. 12, the on- and off-states of the high-side and low-side switches $U_H$, $U_L$, $V_H$, $V_L$, $W_H$ and $W_L$ are represented by 1 (for the switched-on state) and 0 (for the switched-off state). It can be seen that the switching and respectively commutating scheme comprises time sections in which individual motor phases are switched into the high-ohmic state.

The temporal development of the voltages at the three phases of the motor is shown at V(U), V(V) and V(W). The transients in the voltage developments at the motor phases are represented at an enlarged scale in the last two diagrams. The transient times, i.e. the recirculation time periods ($t_u^+$, $t_u^-$, $t_v^+$, $t_v^-$, $t_w^+$, $t_w^-$) will be compared to each other from phase to phase of the motor and respectively across the phases or within a motor phase, in a continuous and/or intermittent and/or sporadic manner from time to time. From this comparison of the recirculation time periods, conclusions can be drawn on faulty conditions of the motor. If the design-based differences of the recirculation time periods occur with cyclic repetition, conclusions can be drawn on asymmetries of the electric motor. Sudden changes or other changes of the recirculation time periods that deviate from the above described pattern allow for conclusions on faulty load conditions. Thus, by the comparison of the recirculation time periods that is provided by the disclosure, there can be obtained a first indicator of a faulty condition of the motor.

However, apart from the block commutation shown in FIG. 12, the method of the disclosure can be realized also in electric motors operating with sine or space vector commutation. In these commutation schemes, there normally do not exist high-ohmic states which would be sufficiently long for detection of the recirculation time period. However, a high-ohmic motor phase can be inserted in the region or the to-be-expected zero crossing. This high-ohmic motor phase can either have a fixed length or, preferably, it will be terminated after conclusion of the time measurement.

Figure 13:
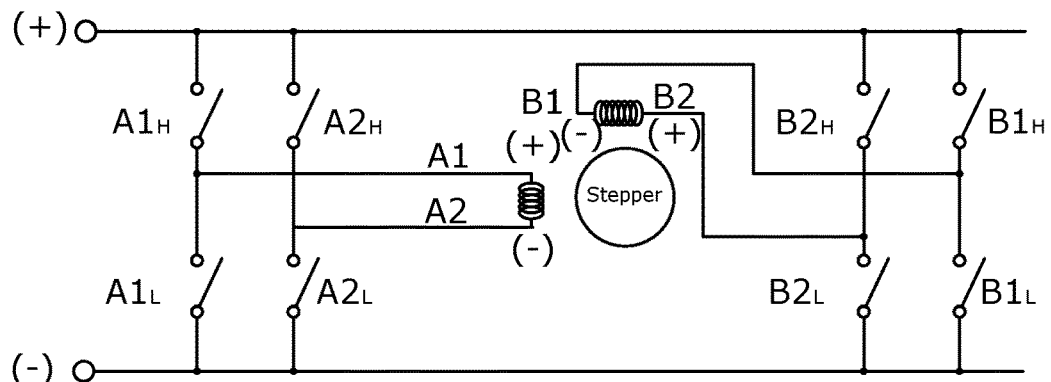
FIG. 13 shows an option for the circuitry for a bipolar electrically commutating motor (e.g. stepper motor)
Figure 14:
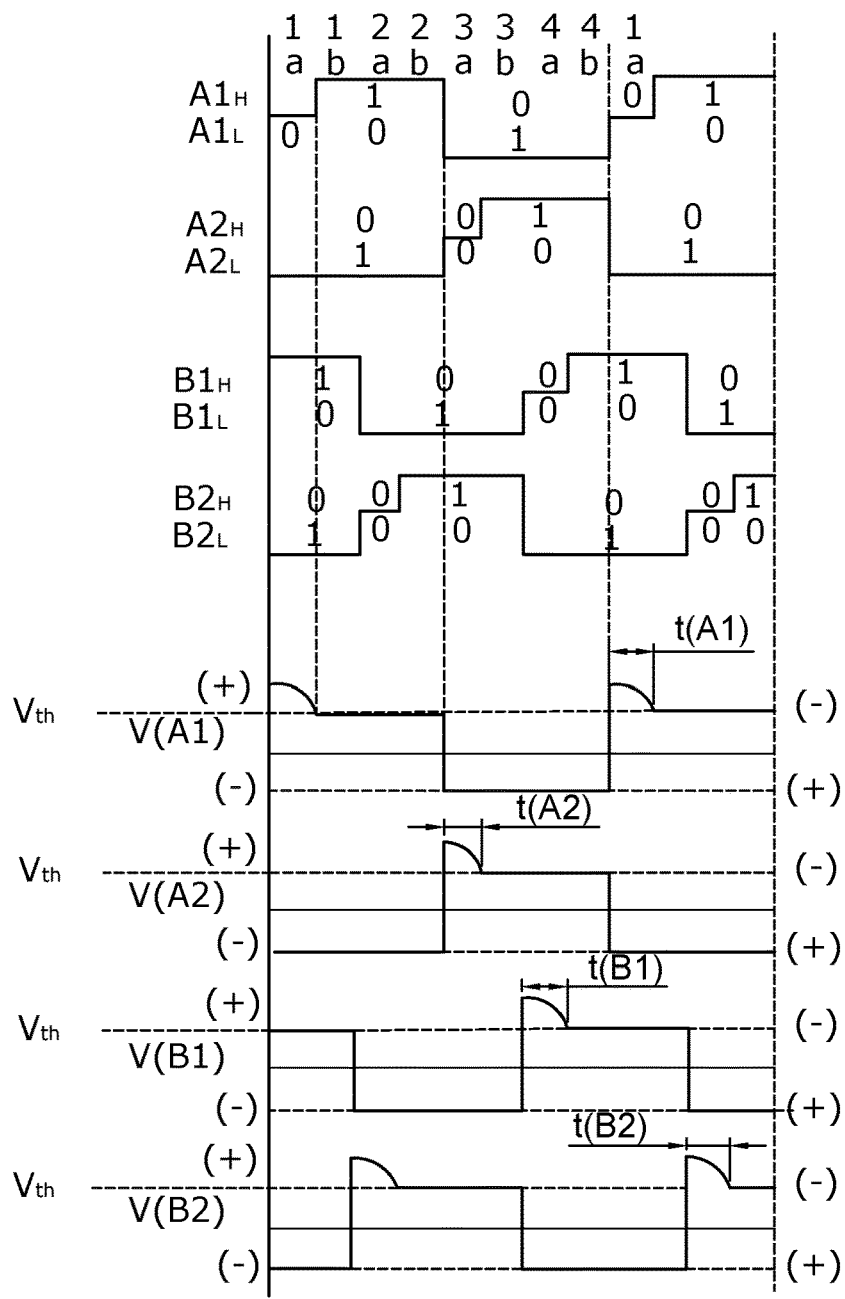
FIG. 14 shows an example for the block commutation of a bipolar electrically commutating motor (e.g. according to FIG. 13).

FIG. 13 shows the circuitry of a bipolar electrically commutated motor with the high-side and low-side switches $A1_H$, $A2_H$, $A1_L$, $A2_L$, $B1_H$, $B2_H$, $B1_L$ and $B2_L$. A corresponding commutation scheme for such an electrically commutated motor is exemplified in FIG. 14. Also here, it can be seen that, in the functional block A, recirculation voltages t(A1), t(A2), t(B1) and t(B2) are compared to each other. This comparison can be performed across the motor phases or, however, within a motor phase and respectively within each motor phase.

A preferred variant of carrying out the detection of the recirculation time period is a logarithmic time measurement. The logarithmic time measurement follows a function that is approximated to a logarithm, notably in such a manner that the speed of the counter will decrease with increasing counting time. This has the following advantages:
a) Long and short time periods can be detected with the same relative precision. There is no unnecessarily high accuracy in measurements of large absolute time periods.
b) The number of bits to be evaluated per measurement value is drastically reduced.
c) Due to the logarithm formation, the detection of time relationships which normally require a "multiplication-or-division"-type calculation can be realized by an "addition-or-subtraction"-type calculation. This will reduce the hardware and software expenditure in the comparison operation.
d) It is possible to perform a less expensive realization of the evaluation either by a smaller logic and/or by a CPU-time-saving realization in a controller.

The invention claimed is:
1. A method for obtaining an indication of a faulty load condition of a multi-phase electric motor with electric commutation having a drive unit which, for each motor phase, comprises a respective high-side switch and a respective low-side switch, wherein the respective high-side switch and the respective low-side switch are cyclically switched according to a switching scheme which comprises at least one respective cyclically recurrent equivalent time point, wherein each of the respective cyclically recurrent equivalent time points have, relative to the respective motor phases, an identical temporal phase shift, and wherein, at each of the respective cyclically recurrent equivalent time points, a respective amount of a current in the respective motor phase is in a substantially identical relation to an amount of a current respectively in each of the other motor phases at the respective cyclically recurrent equivalent time point appertaining respectively to each of the other motor phases, wherein, in the method,
for at least two of the motor phases, at the respective cyclically recurrent equivalent time points of the switching scheme, a respective measurement value is detected which represents the amount of the current in the respective motor phase and detecting the respective measurement values is performed in a cyclically repetitive manner,
the detected measurement values of the respective motor phases are compared to each other at least in pairs, wherein each comparison of the detected measurement values is examined as to whether a result of the comparison is within an expectation range with respect to the compared motor phases for fault-free load conditions, and wherein
a deviation of the result of the comparison from the respective expectation range or from the respective expectation range inclusive of consideration of a presettable allowable tolerance, is evaluated as being an indication of a faulty load condition, wherein a repetition of sequentially occurring deviations can provide a conclusion on a site of the faulty load condition,
and/or
an analysis of the measurement values of at least one of the motor phases is performed, at the respective cyclically recurrent equivalent time points, in sequential succession and a deviation of the results of the comparisons of measurement values, existing at the equivalent time points, of the at least one of the motor phases from the expectation range or from the expectation range inclusive of consideration of a presettable allowable tolerance, is evaluated as being the indication of the faulty load condition, wherein the repetition of sequentially occurring deviations can provide the conclusion on the site of the faulty load condition,
wherein:
high-side switches of at least two respective motor phases are respectively assigned a high-side monitoring unit for monitoring a respective drain-source voltage drop of the respective high-side switch and/or low-side switches of at least two respective motor phases are respectively assigned a low-side monitoring unit for monitoring a respective drain-source voltage drop of the respective low-side switch, wherein each high-side monitoring unit and each low-side monitoring unit is used for detection of a respective measurement value representing the amount of current in the respective motor phase,
each of the high-side monitoring units and each of the low-side monitoring units comprises a comparator and a digital/analog converter for presetting a reference value as a voltage-drop threshold value for detecting an overcurrent condition in the respective high-side switch or the respective low-side switch for the comparator, and in a first phase, evaluation of the overcurrent condition is disabled, and the reference value is modulated for detecting, by evaluation of the comparator, a measurement value representing an amount of a present current, wherein a response of the comparator occurring during modulation of the reference value for detecting of the measurement value representing the amount of the present current indicates that the detection of the measurement value is concluded and, subsequently, in a second phase, evaluation of the overcurrent condition is enabled, the digital/analog converter is switched to an overcurrent reference value and, a response of the comparator is evaluated as an overcurrent condition.

2. The method according to claim 1, wherein the modulation of the reference value starts at the overcurrent reference value and continues toward lower amounts, wherein, for detecting the measurement value representing the amount of the present current, the comparator is operative to respond only once at an end of the reduction.

3. The method according to claim 2, wherein the modulation of the reference value toward lower amounts is performed in logarithmically approximated amounts in such a manner that a percentage reduction is approximately equal from one amount to a next amount.

4. The method according to claim 1, wherein the modulation of the reference value is performed according to a successive approximation, wherein, upon each response of the comparator, the detection of the measurement value is interrupted so as to insert an evaluation of the overcurrent condition.

5. The method according to claim 1, wherein from a motor phase pairing or a motor phase combination for which the deviation from the expectation range is detected, and from a position of the appertaining respective cyclically recurrent equivalent time points within the switching scheme, a conclusion is drawn on a type of the faulty load condition based at least in part on the deviation.

6. The method according to claim 1, wherein the deviation evaluated as being the indication of the faulty load condition is examined for temporal repetition and, in case of at least cyclically continuous repetition, the faulty load condition is concluded to exist when a presettable frequency is exceeded.

7. The method according to claim 1, wherein, when, in a fault-free system comprising at least the electric motor and the drive unit, a cyclically reproducible indication of the faulty load condition is detected, the indication is not attributable to an actual faulty load condition but to an electrical and/or mechanical asymmetry between the motor phases of at least one component of the system selected from a set including the drive unit, motor mechanics, a transmission, and another component driven by the electric motor, and the asymmetry is considered in determining future presettable expectation value ranges for the fault-free system.

8. The method according to claim 1, wherein, when, in a fault-free system comprising at least the electric motor and the drive unit, a cyclically reproducible indication of the faulty load condition is detected, the indication is not attributable to an actual faulty load condition but to an electrical and/or mechanical asymmetry between the motor phases of at least one component of the system selected from a set including the drive unit, motor mechanics, a transmission, and another component driven by the electric motor, and the asymmetry is compensated, via modulation of the switching scheme, for obtaining improved system properties.

9. The method according to claim 1, wherein the indication of the faulty load condition is a result of a deviation of a commutation angle from a desired value and, in this case, the drive unit is operative to compensate for the deviation of the commutation by adapting at least one drive parameter selected from a set of drive parameters including amplitude, phase, and, rotational frequency.

10. The method according to claim 1, wherein, in case of a three-phase electric motor, a the cyclically recurrent equivalent time point where the measurement value is detected in at least one of the motor phases is identical with a time point where, at another one of the motor phases, a zero current is detected.

11. The method according to claim 1, wherein the measurement value representing the amount of the current is a voltage drop and further wherein, for detection of the result of the comparison of two measurement values, differences and/or absolute values of individual voltage drops are applied to switched capacitances and are treated and/or evaluated by means of at least one method from a set of methods including amplification, stacking of temporally sequential measurement values, comparison, difference formation, filtration, and A/D conversion.

* * * * *